(12) United States Patent
Nagata et al.

(10) Patent No.: US 9,257,466 B2
(45) Date of Patent: Feb. 9, 2016

(54) SOLID STATE IMAGING DEVICE AND METHOD FOR MANUFACTURING SOLID STATE IMAGING DEVICE

(71) Applicant: Kabushiki Kaisha Toshiba, Minato-ku (JP)

(72) Inventors: Kazuhiro Nagata, Kanagawa (JP); Takayuki Ogasahara, Kanagawa (JP); Katsuo Iwata, Kanagawa (JP); Ninao Sato, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/163,077

(22) Filed: Jan. 24, 2014

(65) Prior Publication Data
US 2014/0264690 A1    Sep. 18, 2014

(30) Foreign Application Priority Data
Mar. 14, 2013 (JP) .................. 2013-051598

(51) Int. Cl.
*H01L 31/0232* (2014.01)
*H01L 31/0236* (2006.01)
*H01L 27/146* (2006.01)

(52) U.S. Cl.
CPC ........ *H01L 27/1461* (2013.01); *H01L 27/1464* (2013.01); *H01L 27/14607* (2013.01); *H01L 27/14621* (2013.01); *H01L 27/14627* (2013.01); *H01L 27/14685* (2013.01); *Y02E 10/50* (2013.01)

(58) Field of Classification Search
CPC ..................... H01L 27/1464; H01L 27/14812; H01L 27/14607; H01L 27/14621; H01L 27/1461; H01L 27/14685; H01L 27/14627; H01L 31/0232; H01L 31/0236; Y02E 10/50
See application file for complete search history.

(56) References Cited

U.S. PATENT DOCUMENTS

| | | | | |
|---|---|---|---|---|
| 7,312,093 | B2 * | 12/2007 | Ryu ................................ | 438/29 |
| 8,525,286 | B2 * | 9/2013 | Hsu et al. ...................... | 257/440 |
| 8,790,954 | B2 * | 7/2014 | Hsu et al. ........................ | 438/71 |
| 2007/0262364 | A1 * | 11/2007 | Hsu et al. ...................... | 257/291 |

(Continued)

FOREIGN PATENT DOCUMENTS

| | | | |
|---|---|---|---|
| JP | 02-073668 | A | 3/1990 |
| JP | 07-074340 | A | 3/1995 |

(Continued)

OTHER PUBLICATIONS

Office Action issued Apr. 21, 2015 in Japanese Patent Application No. 2013-051598 (with English language translation).

(Continued)

*Primary Examiner* — Latanya N Crawford
(74) *Attorney, Agent, or Firm* — Oblon, McClelland, Maier & Neustadt, L.L.P.

(57) ABSTRACT

Certain embodiments provide a solid state imaging device including a plurality of pixels. Each of the pixels has a semiconductor layer which has a charge accumulating layer at a front surface thereof and a filter layer provided above a rear surface of the semiconductor layer. Transmissive wavelength bands of the filter layers included in the pixels are different from each other, and thicknesses which a plurality of the semiconductor layers included in the pixels and including a plurality of the charge accumulating layers have are different from each other.

14 Claims, 19 Drawing Sheets

(56) References Cited

U.S. PATENT DOCUMENTS

| | | | |
|---|---|---|---|
| 2008/0283726 A1* | 11/2008 | Uya et al. | 250/208.1 |
| 2009/0294886 A1* | 12/2009 | Hsu et al. | 257/432 |
| 2010/0237451 A1* | 9/2010 | Murakoshi | 257/432 |
| 2012/0205765 A1* | 8/2012 | Hynecek | 257/432 |
| 2013/0001733 A1 | 1/2013 | Watanabe | |
| 2013/0193547 A1* | 8/2013 | Nakazawa | 257/443 |
| 2014/0145282 A1* | 5/2014 | Shen et al. | 257/432 |
| 2014/0175586 A1* | 6/2014 | Kim et al. | 257/432 |

FOREIGN PATENT DOCUMENTS

| | | |
|---|---|---|
| JP | 2008-004684 A | 1/2008 |
| JP | 2010-225818 A | 10/2010 |
| JP | 2011-003622 A | 1/2011 |
| JP | 2011-114068 A | 6/2011 |
| JP | 2012-064824 A | 3/2012 |
| JP | 2014-63865 A | 4/2014 |
| KR | 10-2006-0010899 A | 2/2006 |
| KR | 10-2010-0028237 A | 3/2010 |
| TW | 201301489 A1 | 1/2013 |

OTHER PUBLICATIONS

Office Action issued Mar. 12, 2015 in Korean Patent Application No. 10-2014-0015997 (with English language translation).

Combined Office Action and Search Report issued Jun. 26, 2015 in Taiwanese Patent Application No. 103102948 (with English language translation and English translation of Category of Cited Documents).

* cited by examiner

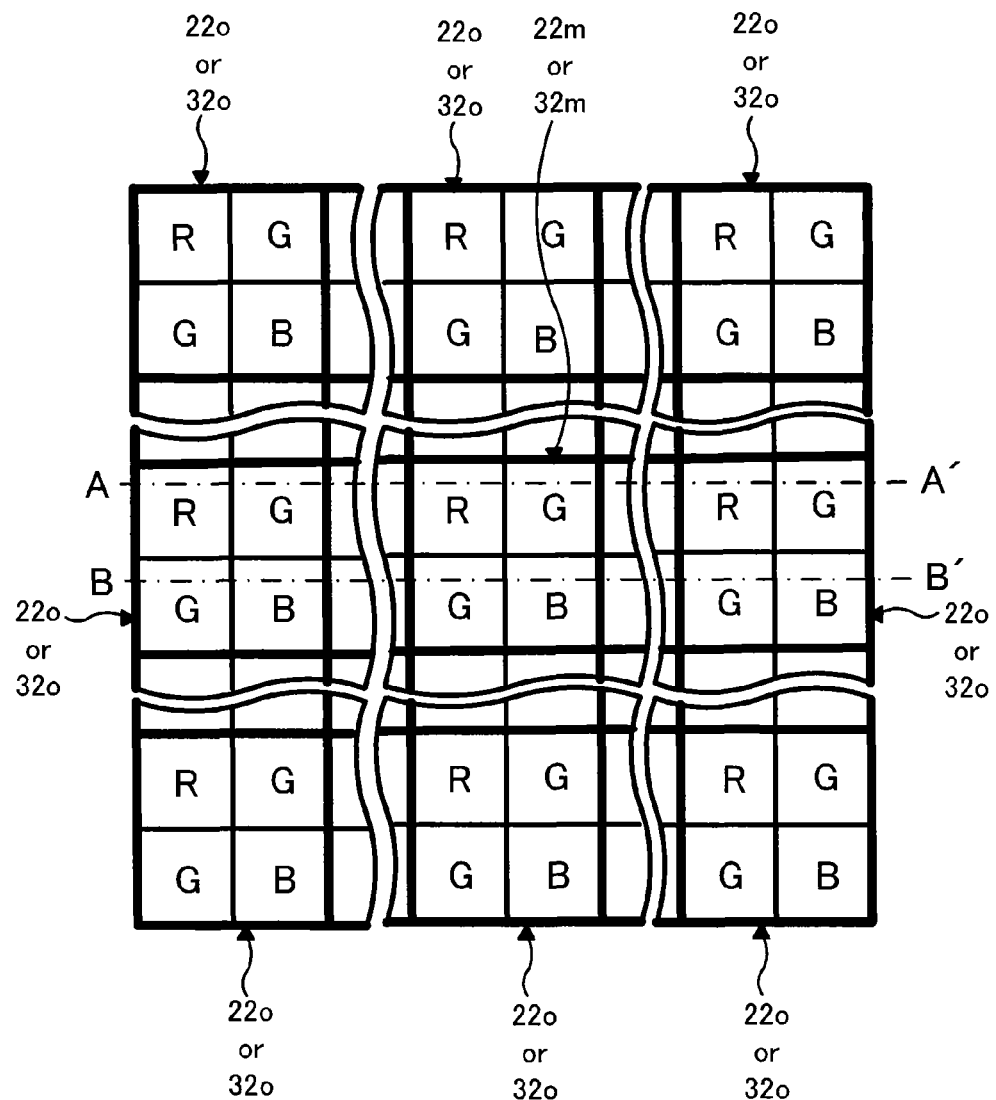

SOLID STATE IMAGING DEVICE AND METHOD FOR MANUFACTURING SOLID STATE IMAGING DEVICE

CROSS REFERENCE TO RELATED APPLICATIONS

This application is based upon and claims the benefit of priority from the prior Japanese Patent Application No. 2013-051598 filed in Japan on Mar. 14, 2013; the entire contents of which are incorporated herein by reference.

FIELD

Embodiments described herein relate generally to solid state imaging device and method for manufacturing the solid state imaging device.

BACKGROUND

In a solid state imaging device of rear surface irradiation type which has a wiring layer on a front surface of a silicon substrate and receives light from the rear surface of the silicon substrate, the silicon substrate is typically thinned. Therefore, a red component light (which will be denoted as R light below) having a low absorption coefficient particularly for silicon is not sufficiently absorbed in the thin silicon substrate and transmits through the silicon substrate. Thus, a conventional solid state imaging device of rear surface irradiation type has a poor sensitivity for the R light, which deteriorates a sensitivity of the solid state imaging device.

When the silicon substrate is made sufficiently thick to absorb the R light in order to suppress the deterioration in the sensitivity of the solid state imaging device, a problem such that color mixture occurs is caused. That is, when a blue component light (which will be denoted as B light below) having a high absorption coefficient for silicon is incident into the silicon substrate, most of the B light is absorbed near the rear surface of the silicon substrate and charges are generated. On the other hand, in the solid state imaging device of rear surface irradiation type, a charge accumulating layer is provided at the portion closer to the front surface of the silicon substrate. Therefore, in the conventional solid state imaging device of rear surface irradiation type, when the silicon substrate is made thicker in order to enhance the sensitivity, a distance between a location where charges are mainly generated and the charge accumulating layer is longer and a moving distance of the generated charges is longer. Thus, the generated charges easily move to the charge accumulating layer in an adjacent pixel, and color mixture occurs.

As described above, it is difficult to realize an enhancement in sensitivity and a reduction in color mixture in the conventional solid state imaging device of rear surface irradiation type.

BRIEF DESCRIPTION OF THE DRAWINGS

FIG. 2A is a cross-section view along the dashed line X-X' of FIG. 1 and FIG. 2B is cross-section view along the dashed line Y-Y' of FIG. 1;

FIG. 3A is a cross-section view corresponding to FIG. 2A and FIG. 3B is a cross-section view corresponding to FIG. 2B;

FIG. 4A is a cross-section view corresponding to FIG. 2A and FIG. 4B is a cross-section view corresponding to FIG. 2B;

FIG. 5A is a cross-section view corresponding to FIG. 2A and FIG. 5B is a cross-section view corresponding to FIG. 2B;

FIG. 6A is a cross-section view corresponding to FIG. 2A and FIG. 6B is a cross-section view corresponding to FIG. 2B;

FIG. 7A is a cross-section view corresponding to FIG. 2A and FIG. 7B is a cross-section view corresponding to FIG. 2B;

FIG. 8A is a cross-section view corresponding to FIG. 2A and FIG. 8B is a cross-section view corresponding to FIG. 2B;

FIG. 9 is a top view schematically illustrating essential parts of a solid state imaging device according to a second embodiment;

FIG. 10A is a cross-section view along the dashed line A-A' of FIG. 9 and FIG. 10B is a cross-section view along the dashed line B-B' of FIG. 9;

FIG. 11A is a cross-section view corresponding to FIG. 10A and FIG. 11B is a cross-section view corresponding to FIG. 10B;

FIG. 12A is a cross-section view corresponding to FIG. 10A and FIG. 12B is a cross-section view corresponding to FIG. 10B;

FIG. 14A is a cross-section view along the dashed line A-A' of FIG. 9 and FIG. 14B is a cross-section view along the dashed line B-B' of FIG. 9;

FIG. 15A is a cross-section view corresponding to FIG. 14A and FIG. 15B is a cross-section view corresponding to FIG. 14B;

FIG. 16A is a cross-section view corresponding to FIG. 14A and FIG. 16B is a cross-section view corresponding to FIG. 14B;

DESCRIPTION OF THE EMBODIMENTS

Certain embodiments provide a solid state imaging device including a plurality of pixels. Each of the pixels has a semiconductor layer which has a charge accumulating layer at a front surface thereof and a filter layer provided above a rear surface of the semiconductor layer. Tansmissive wavelength bands of the filter layers included in the pixels are different from each other, and thicknesses which a plurality of the semiconductor layers included in the pixels and including a plurality of the charge accumulating layers have are different from each other.

Certain embodiments provide a method for manufacturing the solid state imaging device including a plurality of pixels. Each of the pixels has a charge accumulating layer provided on a front surface of a semiconductor substrate and a filter layer provided on a rear surface of the semiconductor substrate. Tansmissive wavelength bands of the filter layers included in the pixels are different from each other. The method includes thinning the semiconductor substrate having the charge accumulating layers from the rear surface side to a predetermined thickness, forming concavity and convexity on the rear surface of the semiconductor substrate such that thicknesses of regions of the semiconductor substrate included in the pixels are different from each other, and forming the filter layers having the mutually different transmissive wavelength bands on the rear surface of the semiconductor substrate which has the concavity and convexity on the rear surface thereof.

A solid state imaging device according to the present embodiments will be described below with reference to the drawings.

First Embodiment

Figure 1:
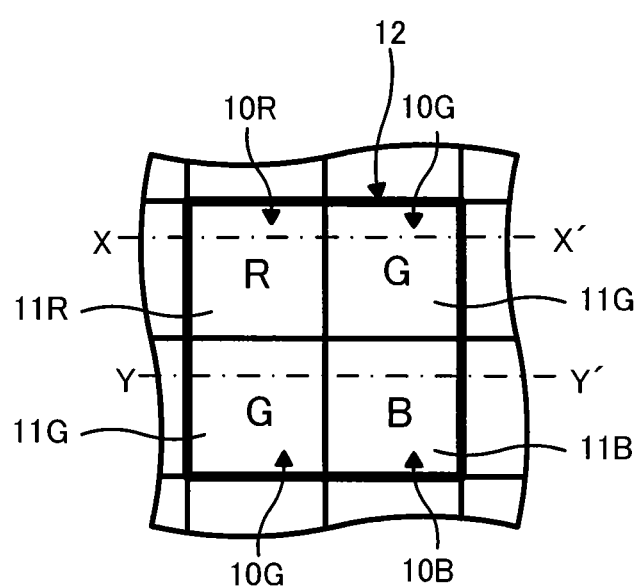
FIG. 1 is a plan view illustrating essential parts of a solid state imaging device according to a first embodiment.
Figure 2A:
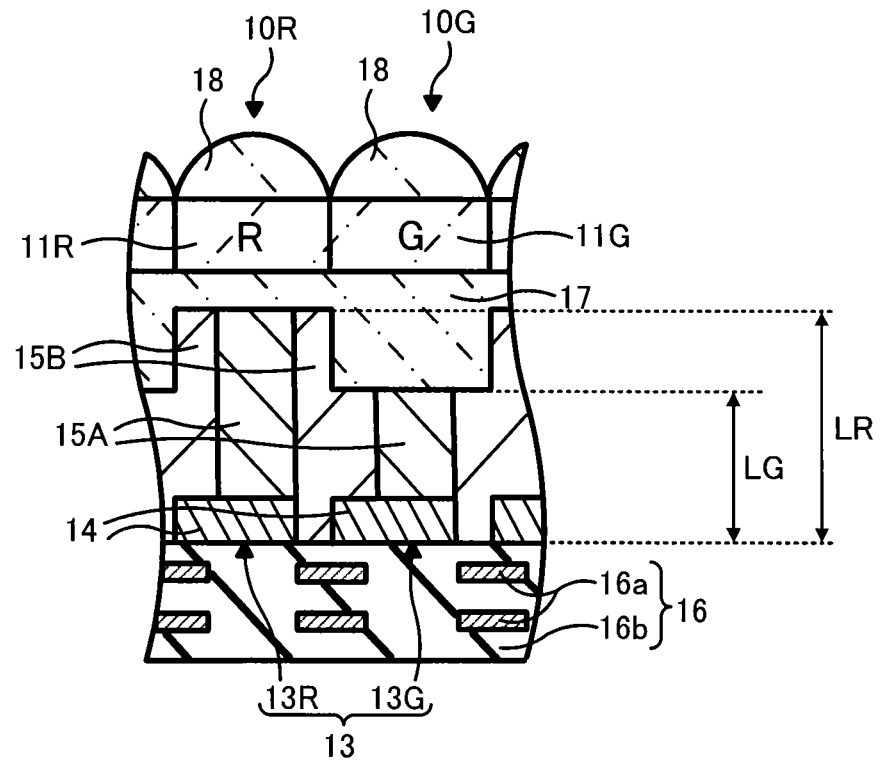
FIGS. 2A and 2B are partial cross-section views of the solid state imaging device illustrated in FIG. 1, where
Figure 2B:
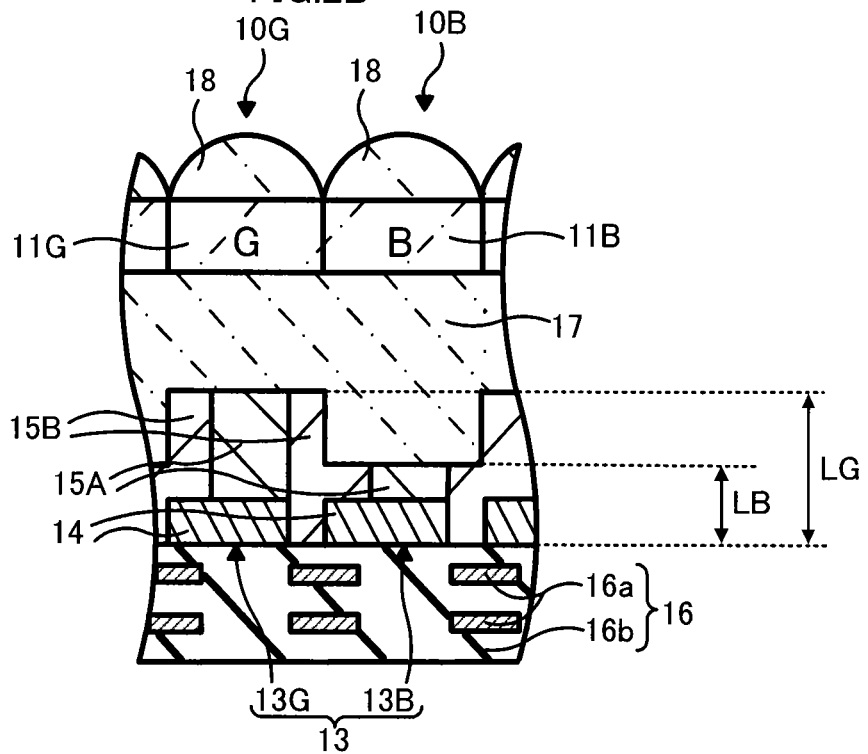

FIG. 1 is atop view schematically illustrating essential parts of a solid state imaging device according to the present embodiment. FIGS. 2A and 2B are partial cross-section views of the solid state imaging device illustrated in FIG. 1. FIG. 2A is a cross-section view along the dashed line X-X' of FIG. 1 and FIG. 2B is a cross-section view along the dashed line Y-Y' of FIG. 1.

As illustrated in FIG. 1, in the solid state imaging device according to the present embodiment, a plurality of pixels is arranged in a lattice shape. The pixels include a red pixel 10R, a green pixel 10G and a blue pixel 10B, which are in the Bayer array.

The red pixel 10R includes a red filter layer 11R having a transmissive wavelength band through which a red component light (which will be denoted as R light below) transmits. The green pixel 10G includes a green filter layer 11G having a transmissive wavelength band through which a green component light (which will be denoted as G light below) transmits. The blue pixel 10B includes a blue filter layer 11B having a transmissive wavelength band through which a blue component light (which will be denoted as B light below) transmits.

In the following description, the pixels including the red pixel 10R, the green pixel 10G and the blue pixel 10B are called a group of pixels 12. In the present embodiment, four pixels arranged as described above, that is, one red pixel 10R, two green pixels 10G and one blue pixel 10B in the Bayer array are called a group of pixels 12. The solid state imaging device actually has groups of pixels 12, in which the groups of pixels 12 are two-dimensionally arranged.

As described later, each of the red pixel 10R, the green pixels 10G and the blue pixel 10B actually has a microlens, but the microlenses are omitted in FIG. 1.

As illustrated in FIGS. 2A and 2B, the red filter layer 11R, the green filter layers 11G, and the blue filter layer 11B are provided on the rear surface side (the upper side in the Figure) of a semiconductor substrate 13. In other words, in the solid state imaging device according to the present embodiment, a light is incident from the rear surface side of the semiconductor substrate 13. The semiconductor substrate 13 is a p type silicon substrate, for example.

The semiconductor substrate 13 has the flat front surface (the lower surface in the Figure) and the uneven rear surface (the upper surface in the Figure). That is, the semiconductor substrate 13 is configured such that a thickness of a region 13R contained in the red pixel 10R, a thickness of a region 13G contained in the green pixel 10G, and a thickness of a region 13B contained in the blue pixel 10B are mutually different. In other words, the semiconductor substrate 13 is configured such that a thickness between the front surface of the semiconductor substrate 13 and a flattened layer 17 on the rear surface side described later is different per color-different pixel.

The thickness of each of the region 13R, the region 13G and the region 13B depends on an absorption coefficient for the semiconductor substrate 13 of light (R light, G light or B light) incident into the region 13R, the region 13G or the region 13B. As the absorption coefficient is lower, the thickness of each of the region 13R, the region 13G or the region 13B is larger.

The absorption coefficients for silicon of the R light, the G light and the B light are lower in the B light, the G light and the R light in this order. Thus, when the pixels contain the red pixel 10R, the green pixels 10G and the blue pixel 10B and the semiconductor substrate 13 is a silicon substrate, the thickness LR of the region 13R contained in the red pixel 10R is the largest (FIG. 2A), and the thickness LB of the region 13B contained in the blue pixel 10B is the smallest (FIG. 2B). The thickness LG of the region 13G contained in the green pixel 10G is smaller than the thickness of the region 13R and larger than the thickness of the region 13B (FIGS. 2A and 2B).

The thicknesses LR, LG and LB of the regions 13R, 13G and 13B depend on the absorption coefficients for the semiconductor substrate 13 of the lights (R light, G light and B light) incident into the regions 13R, 13G and 13B, and are thick enough to be able to sufficiently absorb the lights (R light, G light, and B light) incident into the regions 13R, 13G and 13B, respectively. In addition, the thicknesses LR, LG and LB of the regions 13R, 13G and 13B are thin enough to be able to sufficiently suppress color mixture in the red pixel 10R, the green pixels 10G and the blue pixel 10B. For example, the thickness LR of the region 13R is 2 μm the thickness LG of the region 13G is 1 μm, and the thickness LB of the region 13B is 0.5 μm.

A plurality of charge accumulating layers 14 are provided per pixel 10R, 10G or 10B at the front surface of the semiconductor substrate 13 in which the thicknesses of the regions 13R, 13G and 13B are mutually different. The charge accumulating layer 14 accumulates charges generated by absorption of an incident light (charges generated by photoelectric conversion). The charge accumulating layer 14 is an n+ type impurity layer, for example.

A plurality of semiconductor layers 15A each of which is a first conductive type semiconductor layer is provided in the semiconductor substrate 13 per pixel 10R, 10G or 10B. The semiconductor layer 15A of first conductive type is an n-type impurity layer, for example, and is provided in a region between the rear surface of the semiconductor substrate 13 and a position contacting with the charge accumulating layer 14. The semiconductor layer 15A of first conductive type may be provided by using an n-type semiconductor substrate and may be formed by implanting n-type ions into the semiconductor substrate 13.

Further, a plurality of semiconductor layers 15B each of which is a second conductive type semiconductor layer is provided in the semiconductor substrate 13 per pixel 10R, 10G or 10B. The semiconductor layer 15B of second conductive type is provided to separate the semiconductor layer 15A contained in each pixel 10R, 10G or 10B from the semiconductor layer 15A contained in other pixel 10R, 10G or 10B adjacent to each pixel 10R, 10G or 10B. That is, the semiconductor layer 15B is provided in the semiconductor substrate 13 between the semiconductor layers 15A.

A wiring layer 16 is provided on the front surface of the semiconductor substrate 13 having at least the charge accumulating layers 14. The wiring layer 16 has a plurality of layered wirings 16a and interlayer insulative films 16b provided between the wirings 16a. Though not illustrated, part of the lowermost wiring 16a (part of the wiring 16a closest to the front surface of the semiconductor substrate 13) among the wirings 16a contained in the wiring layer 16 is connected to charge accumulating layer 14. A voltage caused by accumulated charges in the charge accumulating layer 14 is extracted via the wiring 16a.

The transparent flattened layer 17 made of, for example, silicon oxide film is provided on the rear surface of the semiconductor substrate 13 having at least the charge accumulating layers 14. A thickness of the flattened layer 17 is different per pixel 10R, 10G or 10B. However, a sum of the thickness of the semiconductor substrate 13 contained in each pixel 10R, 10G or 10B and the thickness of the flattened layer 17 is substantially equal to a sum of the thickness of the semiconductor substrate 13 contained in other pixel 10R, 10G or 10B and the thickness of the flattened layer 17. That is, the surface of the flattened layer 17 is flattened.

The red filter layer 11R, the green filter layers 11G and the blue filter layer 11B are provided in the Bayer array on the flattened layer 17. Microlenses 18 are provided on the red filter layer 11R, the green filter layers 11G and the blue filter layer 11B, respectively.

A method for manufacturing the solid state imaging device described above will be described below with reference to FIGS. 3 to 6. FIGS. 3 to 6 are diagrams for explaining the method for manufacturing the solid state imaging device illustrated in FIGS. 1 and 2. FIGS. 3A, 4A, 5A and 6A are cross-section views corresponding to FIG. 2A and FIGS. 3B, 4B, 5B and 6B are cross-section views corresponding to FIG. 2B.

Figure 3A:
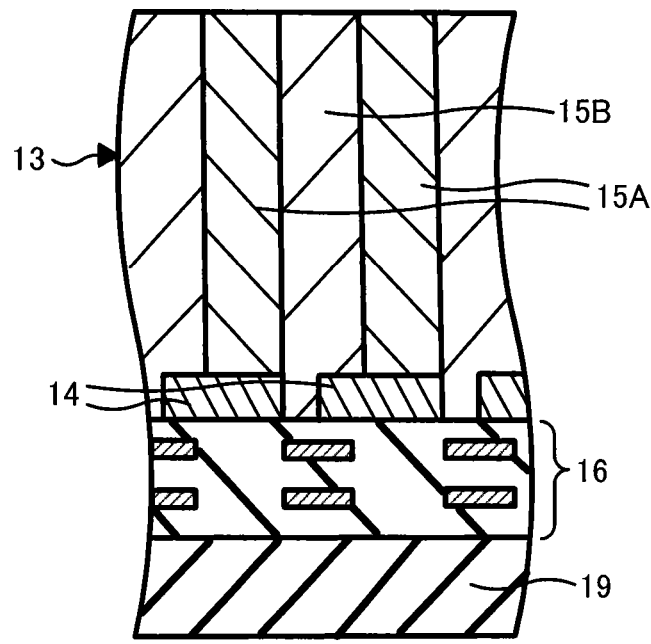
FIGS. 3A and 3B are diagrams for explaining a method for manufacturing the solid state imaging device according to the first embodiment, where
Figure 3B:
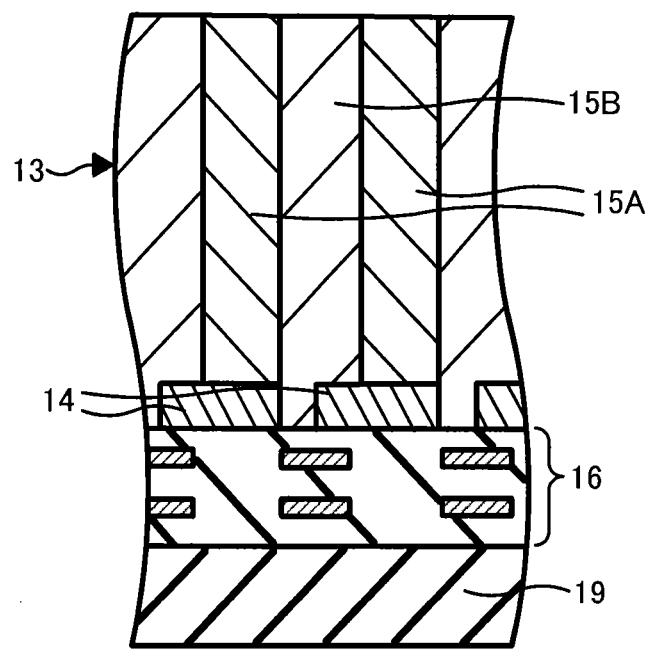

As illustrated in FIGS. 3A and 3B, the wiring layer 16 is formed on the front surface of the semiconductor substrate 13 in which the charge accumulating layers 14 are formed and the semiconductor layers 15A of first conductive type as needed are formed. A support substrate 19 is attached to the semiconductor substrate 13 in which the wiring layer 16 is formed such that the wiring layer 16 is present between the semiconductor substrate 13 and the support substrate 19.

Figure 4A:
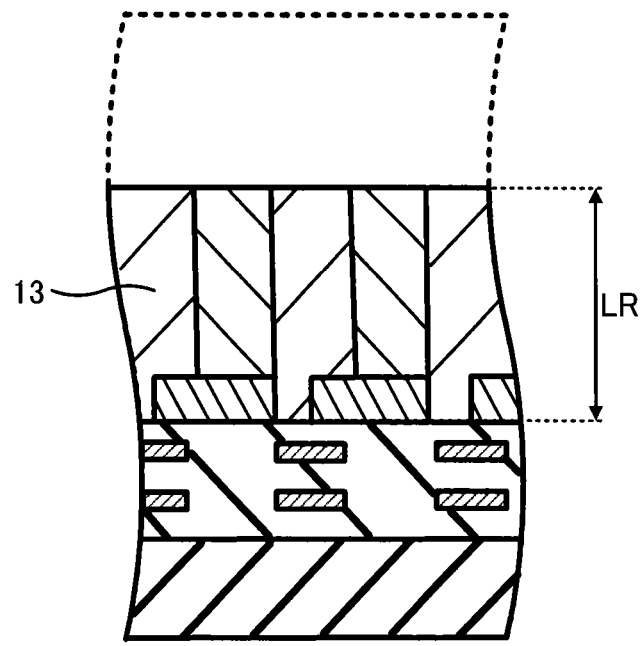
FIGS. 4A and 4B are diagrams for explaining the method for manufacturing the solid state imaging device according to the first embodiment, where
Figure 4B:
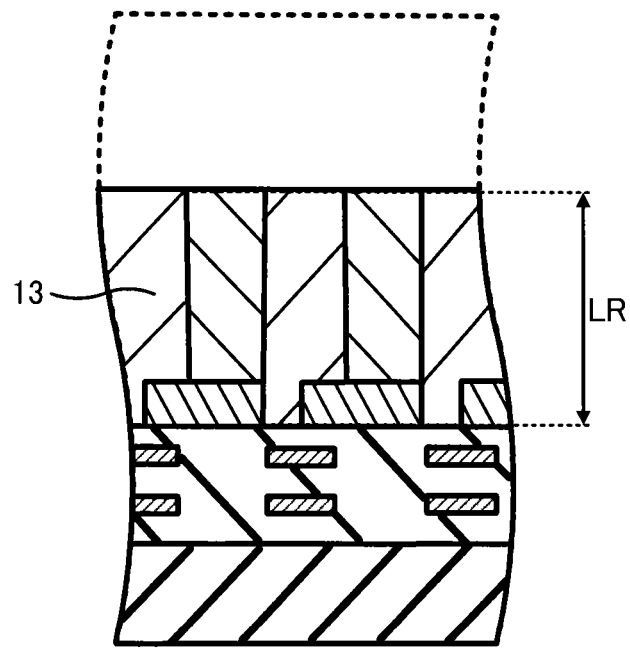

As illustrated in FIGS. 4A and 4B, the entire semiconductor substrate 13 is thinned from the rear surface to a predetermined thickness. The predetermined thickness is a thickness required in the thickest region in the manufactured semiconductor substrate 13, for example. In the present embodiment, as illustrated in FIG. 2A, since the thickness LR of the region 13R contained in the red pixel 10R in the semiconductor substrate 13 is the largest, the entire semiconductor substrate 13 is thinned to have a required thickness LR in the red pixel 10R.

Figure 5A:
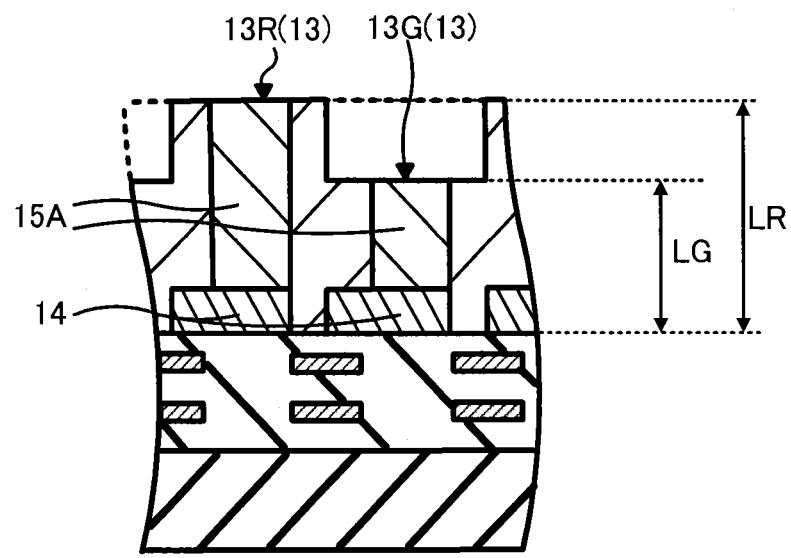
FIGS. 5A and 5B are diagrams for explaining the method for manufacturing the solid state imaging device according to the first embodiment, where
Figure 5B:
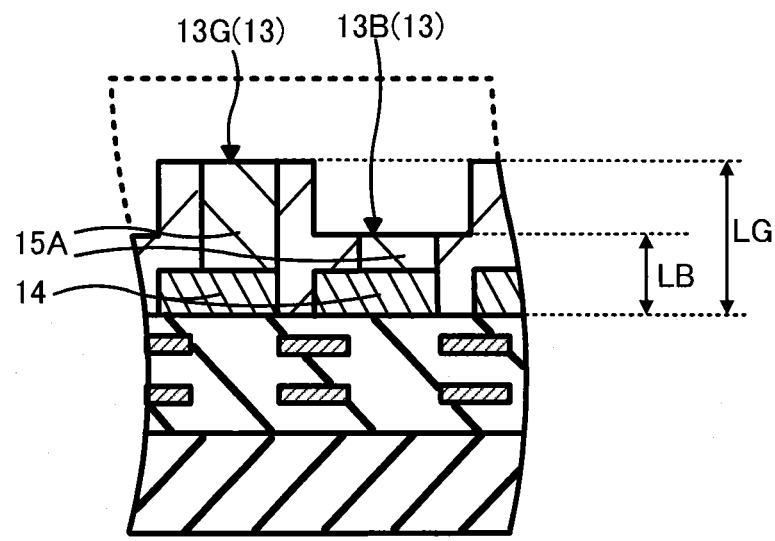

As illustrated in FIGS. 5A and 5B, concavity and convexity is formed on the rear surface of the thinned semiconductor substrate 13. The concavity and convexity is formed by partially thinning the semiconductor substrate 13 with etching, for example.

Specifically, the semiconductor substrate 13 is partially thinned such that the thicknesses of the regions 13R, 13G and 13B of the semiconductor substrate 13 contained in the pixels 10R, 10G and 10B of the manufactured solid state imaging device are mutually different. In the present embodiment, for example, the semiconductor substrate 13 is partially thinned such that the thickness of the region 13G of the semiconductor substrate 13 contained in the manufactured green pixel 10G is LG (<LR) and the thickness of the region 13B of the semiconductor substrate 13 contained in the manufactured blue pixel 10B is LB (<LG). Through this process, the semiconductor substrate 13 is formed to be thinner in the region 13R, the region 13G and the region 13B in this order.

The semiconductor layers 15A of first conductive type are also thinned at the same time with the partial thinning of the semiconductor substrate 13. Therefore, the semiconductor layers 15A are formed to contact with the charge accumulating layers and to be exposed from the rear surface of the semiconductor substrate 13, respectively. The thickness of the semiconductor substrate 13 is different per region 13R, 13G or 13B, and thus the thicknesses of the semiconductor layers 15A are also different per region 13R, 13G or 13B.

Figure 6A:
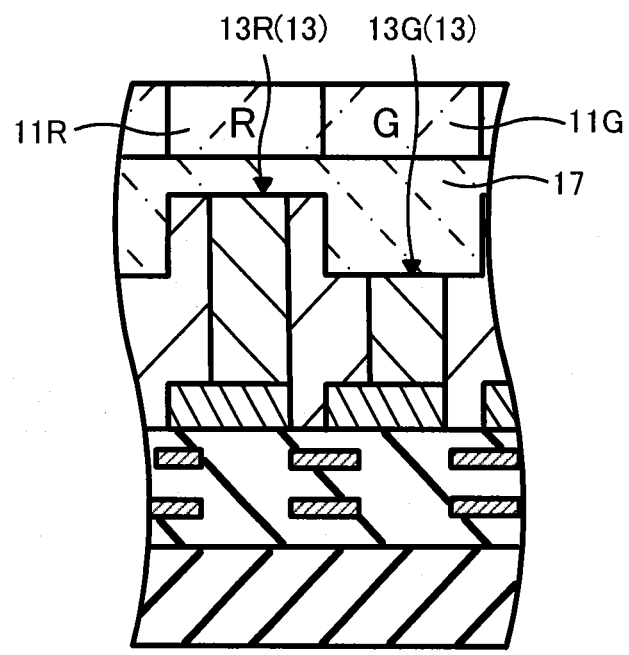
FIGS. 6A and 6B are diagrams for explaining the method for manufacturing the solid state imaging device according to the first embodiment, where
Figure 6B:
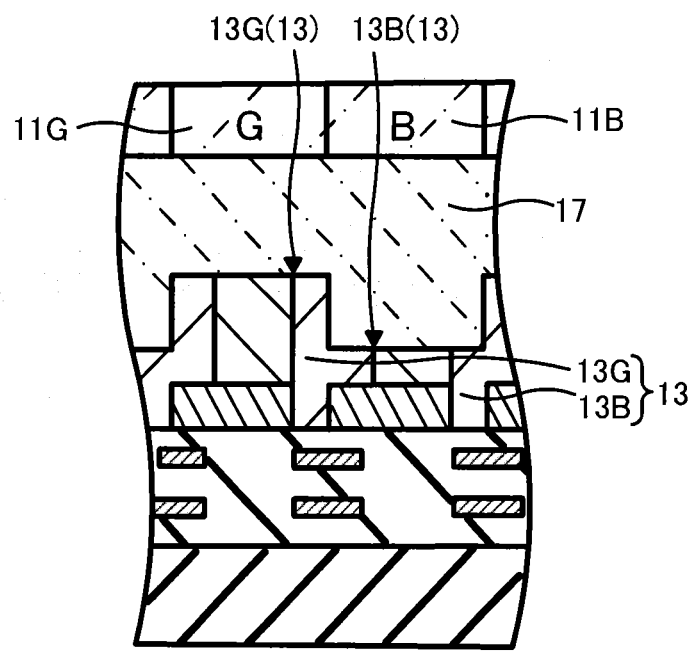

After the concavity and convexity is formed on the rear surface of the semiconductor substrate 13 as described above, the flattened layer 17 is formed on the rear surface of the semiconductor substrate 13 as illustrated in FIGS. 6A and 6B, and then the red filter layers 11R, the green filter layers 11G and the blue filters layer 11B are formed at predetermined positions on the flattened layer 17. Each of the red filter layers 11R is formed at a position contained in the red pixel 10R of the manufactured solid state imaging device (above the rear surface of the region 13R of the semiconductor substrate 13, for example). Each of the green filter layers 11G is formed at a position contained in the green pixel 10G of the manufactured solid state imaging device (above the rear surface of the region 13G of the semiconductor substrate 13, for example). Each of the blue filter layers 11B is formed at a position contained in the blue pixel 10B of the manufactured solid state imaging device (above the rear surface of the region 13B of the semiconductor substrate 13, for example).

Finally, the microlenses 18 are formed on the red filter layers 11R, the green filter layers 11G and the blue filter layers 11B, and the solid state imaging device illustrated in FIGS. 1 and 2 is manufactured.

Figure 7A:
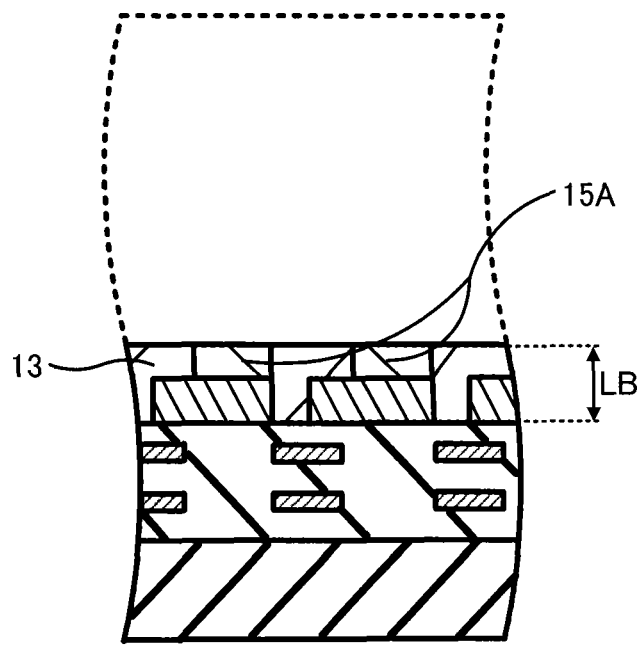
FIGS. 7A and 7B are diagrams for explaining a variant of the method for manufacturing the solid state imaging device according to the first embodiment, where
Figure 7B:
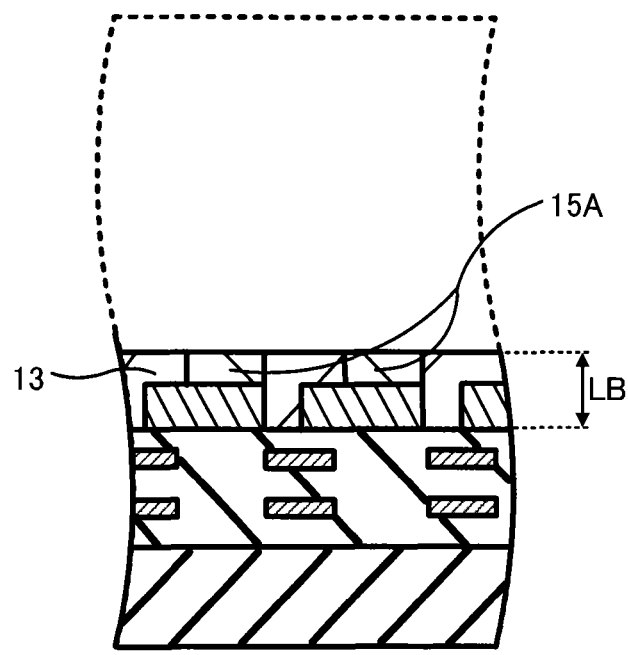
Figure 8A:
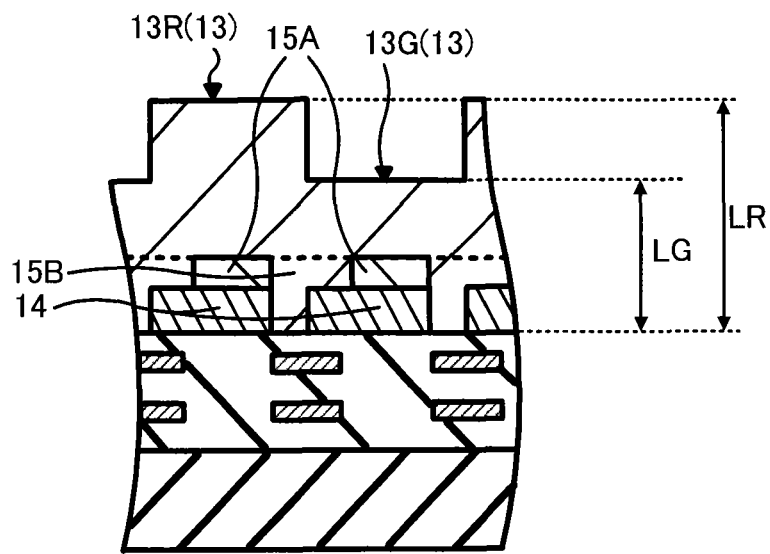
FIGS. 8A and 8B are diagrams for explaining the variant of the method for manufacturing the solid state imaging device according to the first embodiment, where
Figure 8B:
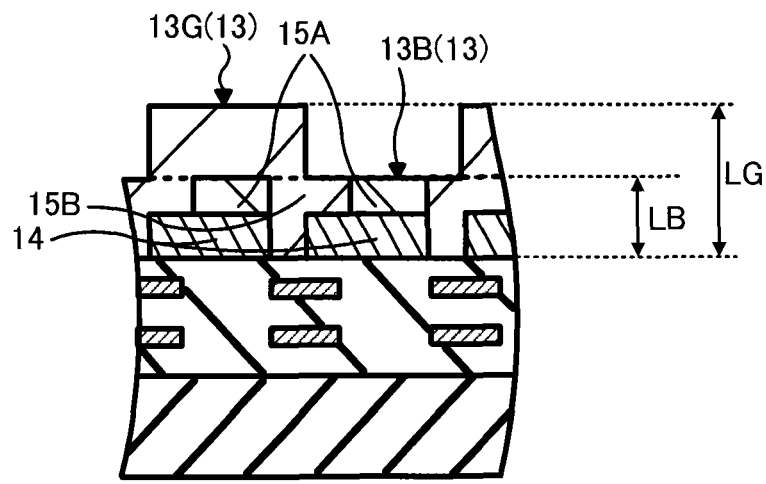

The method for manufacturing the solid state imaging device is not limited to the manufacturing method described above. A variant of the method for manufacturing the solid state imaging device according to the first embodiment will be described below with reference to FIGS. 7 and 8. FIGS. 7 and 8 are diagrams for explaining the variant of the method for manufacturing the solid state imaging device according to the first embodiment. FIGS. 7A and 8A are cross-section views corresponding to FIG. 2A and FIGS. 7B and 8B are cross-section views corresponding to FIG. 2B.

After the process illustrated in FIGS. 3A and 3B, as illustrated in FIGS. 7A and 7B, the entire semiconductor substrate 13 is thinned from the rear surface to a predetermined thickness. In the manufacturing method according to the variant, the predetermined thickness is a thickness required in the thinnest region in the manufactured semiconductor substrate 13, for example. In the present embodiment, as illustrated in FIG. 2A, the thickness LB of the region 13B contained in the blue pixel 10B in the semiconductor substrate 13 is the smallest, and thus the entire semiconductor substrate 13 is thinned to have a required thickness LB in the blue pixel 10B.

Next, concavity and convexity is formed on the rear surface of the thinned semiconductor substrate 13 as illustrated in FIGS. 8A and 8B. The concavity and convexity on the rear surface of the semiconductor substrate 13 is formed by partially thickening the semiconductor substrate 13 with epitaxial growth of the same material as the semiconductor substrate 13, for example.

Specifically, the semiconductor substrate 13 is partially thickened such that the thicknesses of the regions 13R, 13G and 13B of the semiconductor substrate 13 contained in the pixels 10R, 10G and 10B in the manufactured solid state imaging device are mutually different. In the present embodiment, for example, the semiconductor substrate 13 is partially thickened such that the thickness of the region 13G of the semiconductor substrate 13 contained in the manufactured green pixel 10G is LG (>LB) and the thickness of the region 13R of the semiconductor substrate 13 contained in the manufactured red pixel 10R is LR (>LG). Through this process, the semiconductor substrate 13 is formed in which the region 13R, the region 13G and the region 13B are thinner in this order.

When the semiconductor substrate 13 is partially thickened in this way, the thickness of the semiconductor layer 15A of first conductive type does not change from the thickness of the semiconductor layer 15A illustrated in FIGS. 7A and 7B. Therefore, the semiconductor layer 15A in the region 13B of the semiconductor substrate 13 contained in the blue pixel 10B is formed to contact with the charge accumulating layer 14 and to be exposed from the rear surface of the region 13B, while the semiconductor layer 15A in the region 13R of the semiconductor substrate 13 contained in the red pixel 10R and the semiconductor layers 15A in the regions 13G of the semiconductor substrate 13 contained in the green pixels 10G are formed to contact with the charge accumulating layers 14 and to be embedded in the regions 13R and 13G, respectively. The semiconductor substrate 13 is different in its thickness per region 13R, 13G or 13B, and the thicknesses of all the semiconductor layers 15 are substantially the same.

Thereafter, as illustrated in FIGS. 6A and 6B, the flattened layer 17 is formed on the rear surface of the semiconductor substrate 13, and then the red filter layers 11R, the green filter layers 11G, and the blue filter layers 11B are formed at predetermined positions on the flattened layer 17. Finally, the microlenses 18 are formed on the red filter layers 11R, the green filter layers 11G, and the blue filters layer 11B, respectively. The solid state imaging device illustrated in FIGS. 1 and 2 may be manufactured in this way.

In the manufacturing method, the semiconductor substrate 13 is thinned according to a required thickness in the thinnest region in the manufactured semiconductor substrate 13, and thus the semiconductor layer 15A of first conductive type is correspondingly thinned as illustrated in FIGS. 8A and 8B. Therefore, the semiconductor layer 15A of first conductive type as illustrated in FIGS. 2A and 2B may be formed as needed after the concavity and convexity is formed on the rear surface of the semiconductor substrate 13 as illustrated in FIGS. 8A and 8B and before the flattened layer 17 is formed.

According to the solid state imaging device and the method for manufacturing the solid state imaging device according to the present embodiment described above, the thickness of the semiconductor substrate 13 is different per pixel 10R, 10G or 10B depending on an absorption coefficient for the semiconductor substrate 13 of the light (R light, G light or B light) received by each pixel 10R, 10G or 10B. If the semiconductor substrate 13 is a silicon substrate, the semiconductor substrate 13 is provided to be thicker in the region 13B, the regions 13G and the region 13R in this order. Therefore, the sensitivity of the red pixel 10R receiving the R light can be particularly enhanced to improve the sensitivity of the solid state imaging device. Additionally, color mixture occurring in the blue pixel 10B receiving the B light can be particularly suppressed to suppress color mixture of the solid state imaging device.

According to the first embodiment described above, the thicknesses LR of the regions 13R of the semiconductor substrate 13 contained in the respective red pixels 10R are substantially the same for the red pixels 10R contained in different groups of pixels 12, for example. Similarly, the thicknesses LG of the regions 13G of the semiconductor substrate 13 contained in the respective green pixels 10G are substantially the same for the green pixels 10G contained in different groups of pixels 12, and the thicknesses LB of the regions 13B of the semiconductor substrate 13 contained in the blue pixels 10B are substantially the same for the blue pixels 10B contained in different groups of pixels 12. However, the thicknesses LR of the regions 13R of the semiconductor substrate 13 contained in the respective red pixels 10R may be different between the center part of the semiconductor substrate 13 and the surrounding part for the red pixels 10R contained in different groups of pixels 12, for example. Similarly, the thicknesses LG of the regions 13G of the semiconductor substrate 13 contained in the green pixels 10G may be different between the center part of the semiconductor substrate 13 and the surrounding part for the green pixels 10G contained in different groups of pixels 12, and the thicknesses LB of the regions 13B of the semiconductor substrate 13 contained in the blue pixels 10B may be different between the center part of the semiconductor substrate 13 and the surrounding part for the blue pixels 10B contained in different groups of pixels 12.

Second Embodiment

Figure 10A:
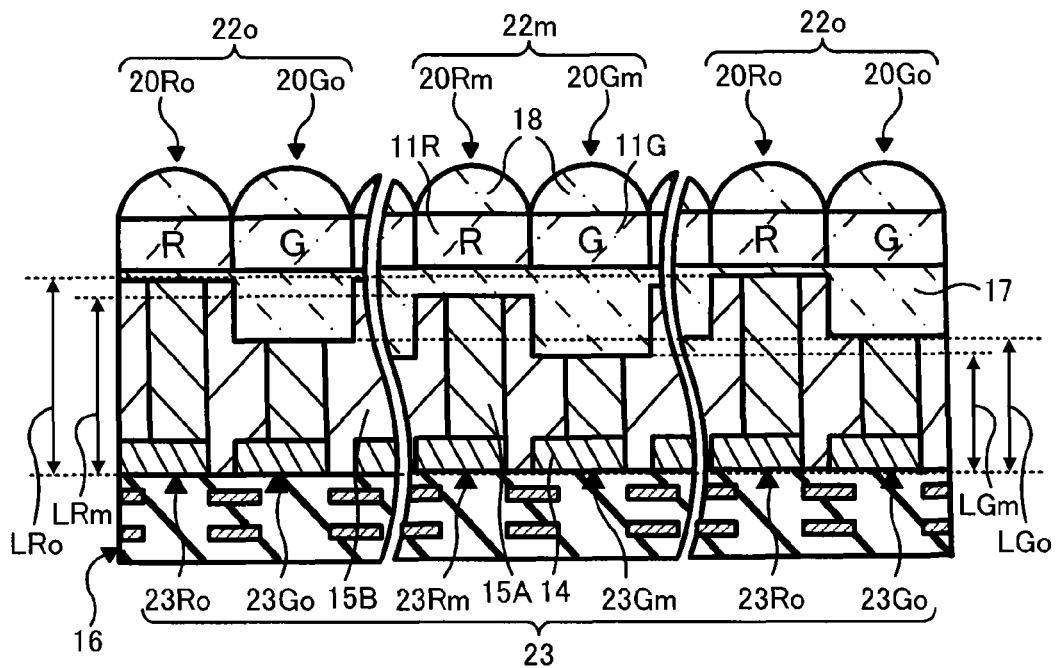
FIGS. 10A and 10B are partial cross-section views of the solid state imaging device illustrated in FIG. 9, where
Figure 10B:
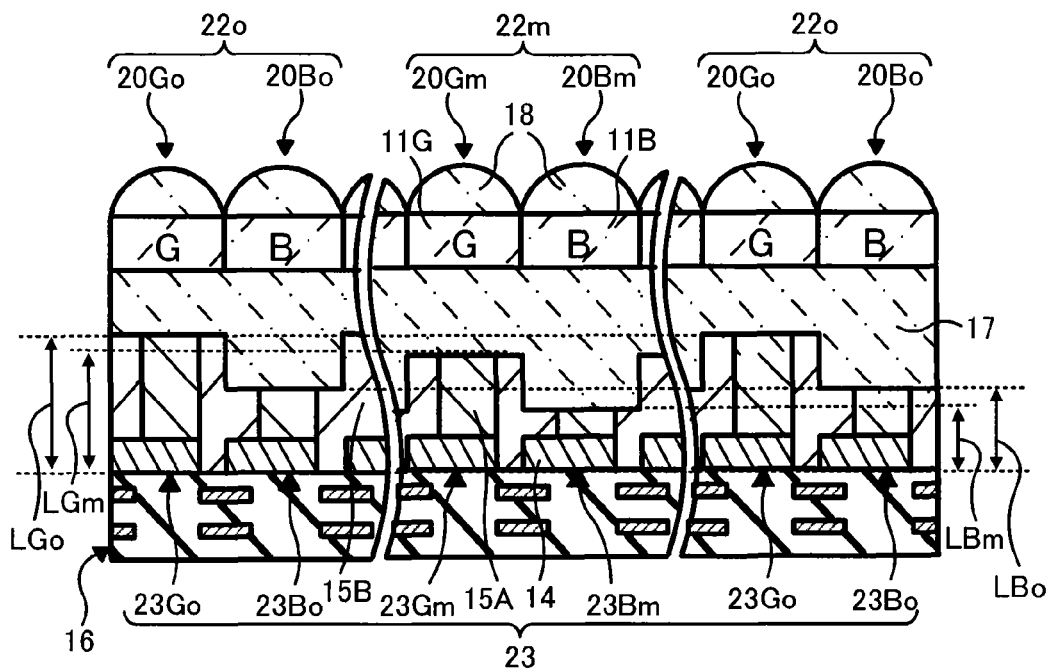

FIG. 9 is a top view schematically illustrating essential parts of a solid state imaging device according to a second embodiment. FIGS. 10A and 10B are partial cross-section views of the solid state imaging device illustrated in FIG. 9. FIG. 10A is a cross-section view along the dashed line A-A' of FIG. 9 and FIG. 10B is a cross-section view along the dashed line B-B' of FIG. 9. The microlenses are omitted also in FIG. 9 similarly as in FIG. 1.

As illustrated in FIG. 9, in the solid state imaging device according to the present embodiment, a group of pixels 22m similar to that in FIG. 1 is arranged at the center part of the semiconductor substrate, and a plurality of groups of pixels 220 similar to those in FIG. 1 except the thickness of the semiconductor substrate are arranged at the surrounding part of the semiconductor substrate so as to surround the group of pixels 22m at the center part. The group of pixels 22m and the groups of pixels 22o are two-dimensionally arranged.

One group of pixels 22m is arranged at the center part of the semiconductor substrate in FIG. 9, but a plurality of groups of pixels 22m may be two-dimensionally arranged at the center part of the semiconductor substrate.

As illustrated in FIGS. 10A and 10B, in the group of pixels 22m at the center part of a semiconductor substrate 23, the semiconductor substrate 23 is provided that a thickness of a region 23Rm contained in a red pixel 20Rm, a thickness of a region 23Gm contained in a green pixel 20Gm, and a thickness of a region 23Bm contained in a blue pixel 20Bm are different from each other.

When the semiconductor substrate 23 is a silicon substrate, in the group of pixels 22m, a thickness LRm of the region 23Rm contained in the red pixel 20Rm is the largest (FIG. 10A), and a thickness LBm of the region 23Bm contained in the blue pixel 20Bm is the smallest (FIG. 10B). A thickness LGm of the region 23Gm contained in the green pixel 20Gm is smaller than the thickness of the region 23Rm and larger than the thickness of the region 23Bm (FIGS. 10A and 10B).

The thicknesses LRm, LGm and LBm of the regions 23Rm, 23Gm and 23Bm depend on the absorption coefficients for the semiconductor substrate 23 of the lights (R light, G light and B light) incident into the regions 23Rm, 23Gm and 23Bm, and are thick enough to be able to sufficiently absorb the lights (R light, G light and B light) incident into the regions 23Rm, 23Gm and 23Bm, respectively. In addition, the thicknesses LRm, LGm and LBm of the regions 23Rm, 23Gm and 23Bm are thin enough to be able to sufficiently suppress color mixture in the red pixel 20Rm, the green pixel 20Gm, and blue pixel 20Bm.

Also in the groups of pixels 22o at the surrounding part of the semiconductor substrate 23, a thickness of a region 23Ro contained in a red pixel 20Ro, a thickness of a region 23Go contained in a green pixel 20Go, and a thickness of a region 23Bo contained in a blue pixel 20Bo are different from each other.

When the semiconductor substrate 23 is a silicon substrate, the thickness LRo of the region 23Ro contained in the red pixel 20Ro is the largest (FIG. 10A) and the thickness LBo of the region 23Bo contained in the blue pixel 20Bo is the smallest (FIG. 10B) in the groups of pixels 22o. The thickness LGo of the region 23Go contained in the green pixel 20Go is smaller than the thickness of the region 23Ro and larger than the thickness of the region 23Bo (FIGS. 10A and 10B).

However, in the solid state imaging device according to the present embodiment, the thickness LRo of the region 23Ro contained in the red pixel 20Ro in the groups of pixels 22o at the surrounding part is larger than the thickness LRm of the region 23Rm contained in the red pixel 20Rm in the group of pixels 22m at the center part. Similarly, the thickness LGo of the region 23Go contained in the green pixel 20Go in the groups of pixels 22o at the surrounding part is larger than the thickness LGm of the region 23Gm contained in the green pixel 20Gm in the group of pixels 22m at the center part, and the thickness LBo of the region 23Bo contained in the blue pixel 20Bo in the groups of pixels 22o at the surrounding part is larger than the thickness LBm of the region 23m contained in the blue pixel 20Bm in the group of pixels 22m at the center part.

In the present embodiment, the red filter layer 11R, the green filter layer 11G, the blue filter layer 11B, the charge accumulating layer 14, the semiconductor layer 15A of first conductive type, the semiconductor layer 15B of second conductive type, the wiring layer 16, the flattened layer 17 and the microlens 18 are the same as those in the solid state imaging device according to the first embodiment, and thus an explanation thereof will be omitted, and they are denoted with the same reference numerals as those in the solid state imaging device according to the first embodiment.

Figure 11A:
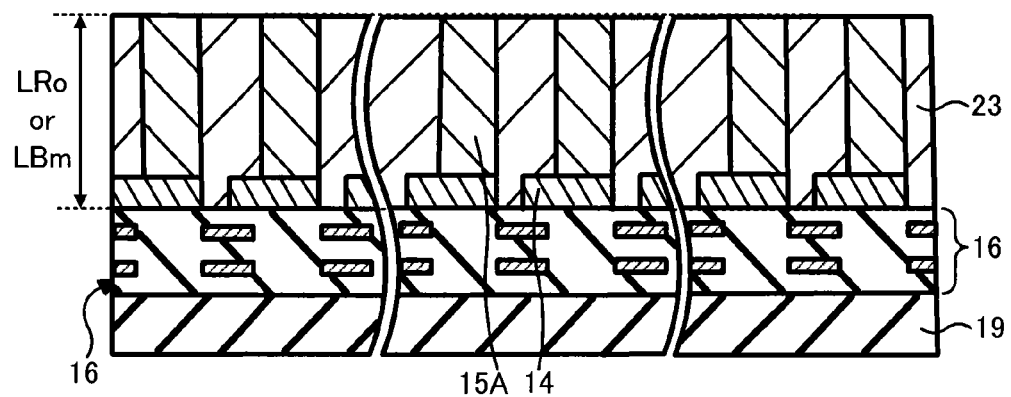
FIGS. 11A and 11B are diagrams for explaining the method for manufacturing the solid state imaging device according to the second embodiment, where
Figure 11B:
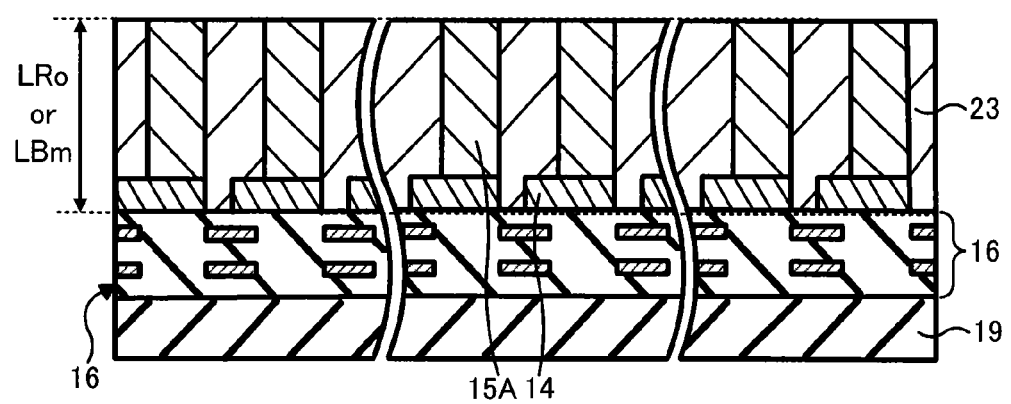
Figure 12A:
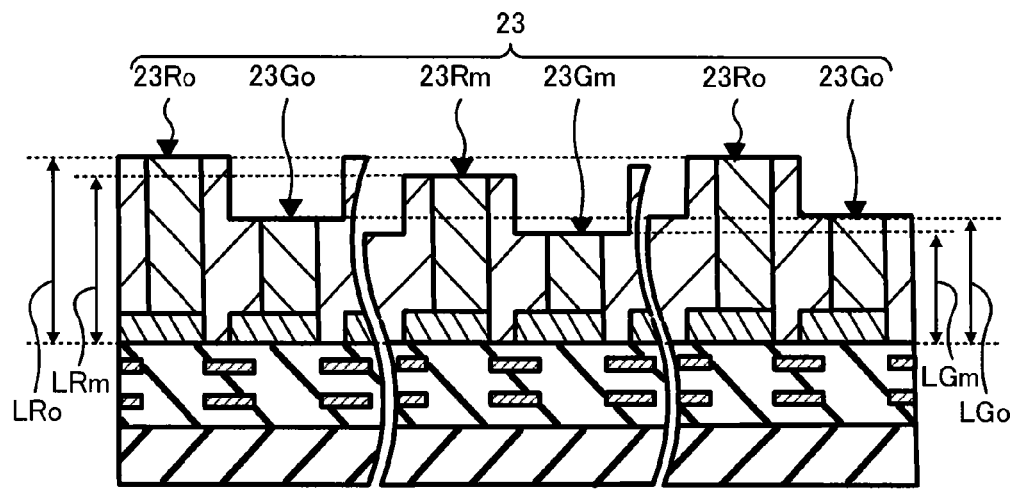
FIGS. 12A and 12B are diagrams for explaining the method for manufacturing the solid state imaging device according to the second embodiment, where
Figure 12B:
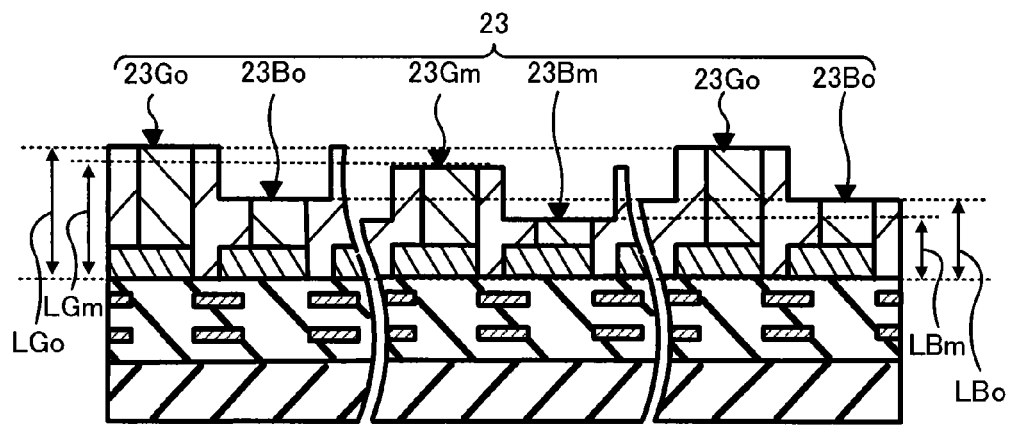

A method for manufacturing the solid state imaging device will be described below with reference to FIGS. 11 and 12. FIGS. 11 and 12 are diagrams for explaining the method for manufacturing the solid state imaging device according to the second embodiment. FIGS. 11A and 12A are cross-section views corresponding to FIG. 10A and FIGS. 11B and 12B are cross-section views corresponding to FIG. 10B.

In the same way as the method illustrated in FIGS. 3A and 3B, the wiring layer 16 is formed on the front surface of the semiconductor substrate 23 in which the charge accumulating layers 14 and the semiconductor layers 15 of first conductive type are formed, and the support substrate 19 is attached such that the wiring layer 16 is present between the semiconductor substrate 23 and the support substrate 19.

As illustrated in FIGS. 11A and 11B, the entire semiconductor substrate 23 is thinned from the rear surface. The semiconductor substrate 23 is thinned to a predetermined thickness. The predetermined thickness is a thickness required in the thickest region in the manufactured semiconductor substrate 23, for example. In the present embodiment, as illustrated in FIG. 10A, the thickness LRo of the region 23Ro contained in the red pixel 20Ro in the groups of pixels 22o at the surrounding part is the largest in the semiconductor substrate 23. Therefore, the entire semiconductor substrate 23 is thinned to have a required thickness LRo in the red pixel 20Ro.

The predetermined thickness may be a thickness required in the thinnest region in the manufactured semiconductor substrate 23. In the present embodiment, as illustrated in FIG. 10B, the thickness LBm of the region 23Bm contained in the blue pixel 20Bm in the group of pixels 22m at the center part is the smallest in the semiconductor substrate 23, and thus the entire semiconductor substrate 23 may be thinned to have a required thickness LBm in the blue pixel 20Bm.

As illustrated in FIGS. 12A and 12B, concavity and convexity is formed on the rear surface of the thinned semiconductor substrate 23. The concavity and convexity on the rear surface of the semiconductor substrate 23 is formed by etching or epitaxial growth, for example. In the process illustrated in FIGS. 11A and 11B, when the entire semiconductor substrate 23 is thinned to have a required thickness LRo in the red pixel 20Ro, the concavity and convexity is formed by partially thinning the semiconductor substrate 23 with etching or the like. In the process illustrated in FIGS. 11A and 11B, when the entire semiconductor substrate 23 is thinned to have a required thickness LBm in the blue pixel 20Bm, the concavity and convexity is formed by partially thickening the semiconductor substrate 23 with epitaxial growth or the like.

Specifically, the concavity and convexity is formed such that the thicknesses of the regions 23Rm, 23Gm and 23Rm of the semiconductor substrate 23 contained in the red pixel 20Rm, the green pixel 20Gm and the blue pixel 20Bm in the group of pixels 22m at the center part in the manufactured solid state imaging device are different from each other and the thicknesses of the regions 23Ro, 23Go and 23Bo of the semiconductor substrate 23 contained in the red pixel 20Ro, the green pixel 20Go and the blue pixel 20Bo in the groups of pixels 22*o* at the surrounding part in the manufactured solid state imaging device are different from each other. Further, the concavity and convexity is formed such that the thickness of the region 23Ro of the semiconductor substrate 23 contained in the red pixel 20Ro in the groups of pixels 22*o* at the surrounding part is different from the thickness of the region 23Rm on the semiconductor substrate 23 contained in the red pixel 20Rm in the group of pixels 22*m* at the center part, the thickness of the region 23Go of the semiconductor substrate 23 contained in the green pixel 20Go in the groups of pixels 22*o* at the surrounding part is different from the thickness of the region 23Gm on the semiconductor substrate 23 contained in the green pixel 20Gm in the group of pixels 22*m* at the center part, and the thickness of the region 23Bo of the semiconductor substrate 23 contained in the blue pixel 20Bo in the groups of pixels 22*o* at the surrounding part is different from the thickness of the region 23Bm on the semiconductor substrate 23 contained in the blue pixel 20Bm in the group of pixels 22*m* at the center part.

In the present embodiment, for example, the concavity and convexity is formed such that in the group of pixels 22*m* at the center part of the manufactured solid state imaging device, the thickness LRm of the region 23Rm of the semiconductor substrate 23 contained in the red pixel 20Rm is larger than the thickness LGm of the region 23Gm of the semiconductor substrate 23 contained in the green pixel 20Gm and the thickness LGm of the region 23Gm of the semiconductor substrate 23 contained in the green pixel 20Gm is larger than the thickness LBm of the region 23Gm of the semiconductor substrate 23 contained in the blue pixel 20Bm. And the concavity and convexity is similarly formed such that in the groups of pixels 22*o* at the surrounding part of the manufactured solid state imaging device, the thickness LRo of the region 23Ro of the semiconductor substrate 23 contained in the red pixel 20Ro is larger than the thickness LGo of the region 23Go of the semiconductor substrate 23 contained in the green pixel 20Go, and the thickness LGo of the region 23Go of the semiconductor substrate 23 contained in the green pixel 20Go is larger than the thickness LBo of the region 23Bo of the semiconductor substrate 23 contained in the blue pixel 20Bo. Further, in the present embodiment, the concavity and convexity is formed such that the thickness LRo of the region 23Ro of the semiconductor substrate 23 contained in the red pixel 20Ro in the groups of pixels 22*o* at the surrounding part is larger than the thickness LRm of the region 23Rm of the semiconductor substrate 23 contained in the red pixel 20Rm in the group of pixels 22*m* at the center part, the thickness LGo of the region 23Go of the semiconductor substrate 23 contained in the green pixel 20Go in the groups of pixels 22*o* at the surrounding part is larger than the thickness LGm of the region 23Gm of the semiconductor substrate 23 contained in the green pixel 20Gm in the group of pixels 22*m* at the center part, and the thickness LBo of the region 23Bo of the semiconductor substrate 23 contained in the blue pixel 20Bo in the groups of pixels 22*o* at the surrounding part is larger than the thickness LBm of the region 23Gm of the semiconductor substrate 23 contained in the blue pixel 20Bm in the group of pixels 22*m* at the center part. Through the process, the semiconductor substrate 23 is formed such that the region 23Gm, 23Bo, the region 23Gm, 23Go, and the region 23Rm, 23Ro are thicker in this order in the same group of pixels, respectively, and the region 23Ro is thicker than the region 23Rm, the region 23Go is thicker than the region 23Gm, and the region 23Bo is thicker than the region 23Gm in different groups of pixels.

After the concavity and convexity is formed on the rear surface of the semiconductor substrate 23 in this way, as in the process illustrated in FIGS. 6A and 6B, the flattened layer 17 is formed on the rear surface of the semiconductor substrate 23, and then the red filter layer 11R, the green filter layers 11G and the blue filter layer 11B are formed at predetermined positions on the flattened layer 17. Finally, the microlenses 18 are formed on the red filter layer 11R, the green filter layers 11G, and the blue filter layer 11B, and thus the solid state imaging device illustrated in FIGS. 9, 10A and 10B are manufactured.

According to the solid state imaging device and the method for manufacturing the solid state imaging device according to the present embodiment described above, the thickness of the semiconductor substrate 23 in the same group of pixels 22*m* or 22*o* is different per pixel 20Rm, 20Ro, 20Gm, 20Go, 20Bm, or 20Bo depending on the absorption coefficient for the semiconductor substrate 23 of the light (R light, G light, or B light) received in each pixel 20Rm, 20Ro, 20Gm, 20Go, 20Bm or 20Bo. When the semiconductor substrate 23 is a silicon substrate, the semiconductor substrate 23 is provided such that, in the same group of pixels 22*m* or 22*o*, the region 23Bm, 23Bo, the region 23Gm, 23Go, and the region 23Rm, 23Ro are thicker in this order. Therefore, the sensitivity of the red pixels 20Rm and 20Ro receiving the R light can be particularly enhanced to improve the sensitivity of the solid state imaging device, and additionally color mixture occurring in the blue pixels 20Bm and 20Bo receiving the B light can be particularly suppressed to suppress color mixture in the solid state imaging device.

The solid state imaging device according to the second embodiment is configured such that the thickness LRo of the region 23Ro of the semiconductor substrate 23 contained in the red pixel 20Ro in the groups of pixels 22*o* at the surrounding part is larger than the thickness LRm of the region 23Rm of the semiconductor substrate 23 contained in the red pixel 20Rm in the group of pixels 22*m* at the center part, the thickness LGo of the region 23Go of the semiconductor substrate 23 contained in the green pixel 20Go in the groups of pixels 22*o* at the surrounding part is larger than the thickness LGm of the region 23Gm of the semiconductor substrate 23 contained in the green pixel 20Gm in the group of pixels 22*m* at the center part, and the thickness LBo of the region 23Bo of the semiconductor substrate 23 contained in the blue pixel 20Bo in the groups of pixels 22*o* at the surrounding part is larger than the thickness LBm of the region 23Bm of the semiconductor substrate 23 contained in the blue pixel 20Bm in the group of pixels 22*m* at the center part. Therefore, the sensitivity of each pixel 20Ro, 20Go or 20Bo contained in the groups of pixels 22*o* at the surrounding part can be enhanced. Consequently, a difference between the sensitivity of each pixel 20Ro, 20Go or 20Bo and the sensitivity of each pixel 20Rm, 20Gm or 20Bm contained in the group of pixels 22*m* at the center part can be reduced. There will be described below why the sensitivity of each pixel 20Ro, 20Go or 20Bo contained in the groups of pixels 22*o* at the surrounding part can be enhanced.

Figure 13A:
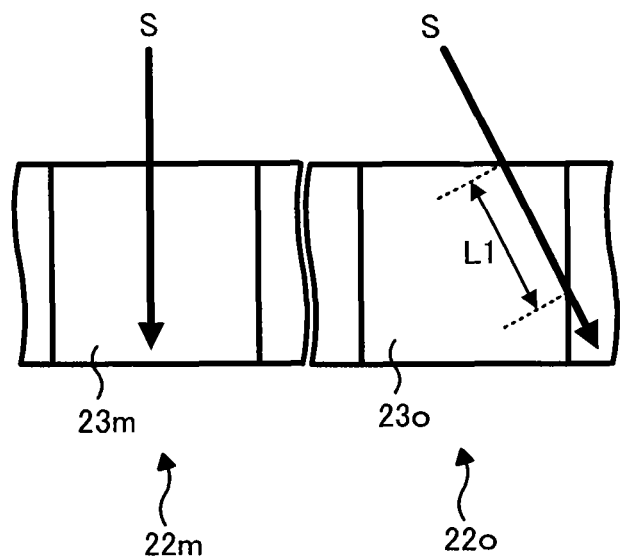
FIGS. 13A and 13B are diagrams for explaining why a sensitivity of a pixel in groups of pixels at the surrounding part can be enhanced, and schematically illustrate a semiconductor substrate contained in an arbitrary pixel in a group of pixels at the center part and a semiconductor substrate contained in an arbitrary pixel in the groups of pixels at the surrounding part, respectively.
Figure 13B:
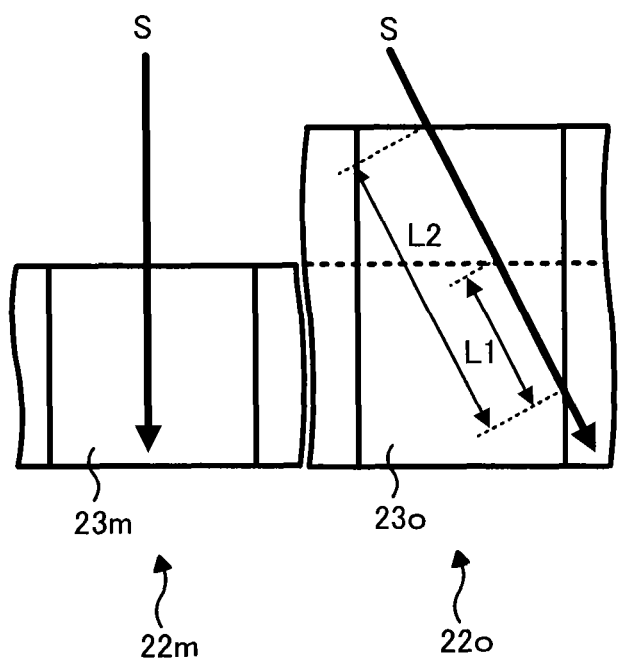

FIGS. 13A and 13B are diagrams for explaining why the sensitivity of each pixel 20Ro, 20Go or 20Bo contained in the groups of pixels 22*o* at the surrounding part can be enhanced, and are diagrams schematically illustrating the semiconductor substrate 23*m* contained in an arbitrary pixel in the group of pixels 22*m* at the center part and the semiconductor substrate 23*o* contained in an arbitrary pixel in the groups of pixels 22*o* at the surrounding part. An arbitrary pixel in the group of pixels 22*m* at the center part and an arbitrary pixel in the groups of pixels 22*o* at the surrounding part are assumed to be of the same color.

As illustrated in FIG. 13A, light S is incident into the rear surface of the semiconductor substrate 23m substantially in the vertical direction for the semiconductor substrate 23m contained in an arbitrary pixel in the group of pixels 22m at the center part. Therefore, if the thickness of the semiconductor substrate 23m is thick enough to be able to sufficiently absorb the light S incident into the substrate 23m, the sensitivity of an arbitrary pixel in the group of pixels 22m at the center part can be set at a desired sensitivity.

However, the light S is obliquely incident into the rear surface of the semiconductor substrate 23o for the semiconductor substrate 23o contained in an arbitrary pixel in the groups of pixels 22o at the surrounding part. The incident light S obliquely traverses the semiconductor substrate 23o. Therefore, even when the thickness of the semiconductor substrate 23o is the same as the thickness of the semiconductor substrate 23m, a distance L1 of the light path in the semiconductor substrate 23o is shorter. Therefore, the light S is not sufficiently absorbed in the semiconductor substrate 23o. Thus, the sensitivity of a pixel in the groups of pixels 22o at the surrounding part is lower than the sensitivity of a pixel in the group of pixels 22m at the center part. Consequently, the sensitivity of a pixel in the groups of pixels 22o at the surrounding part is different from the sensitivity of a pixel in the group of pixels 22m at the center part.

To the contrary, as illustrated in FIG. 13B, when the thickness of the semiconductor substrate 23o contained in an arbitrary pixel in the groups of pixels 22o at the surrounding part is larger than that of the semiconductor substrate 23m contained in an arbitrary pixel in the group of pixels 22m at the center part, even if the light S is obliquely incident into the rear surface of the semiconductor substrate 23o, a distance L2 of the light path in the semiconductor substrate 23o can be prolonged more than the distance L1. Thus, the light S can be sufficiently absorbed in the semiconductor substrate 23o. Therefore, the sensitivity of a pixel in the groups of pixels 22o at the surrounding part can be enhanced. Consequently, it is possible to reduce a difference between the sensitivity of a pixel in the group of pixels 22m at the center part and the sensitivity of a pixel in the groups of pixels 22o at the surrounding part.

The sensitivity of each pixel 20Ro, 20Go or 20Bo contained in the groups of pixels 22o at the surrounding part can be enhanced in the solid state imaging device according to the second embodiment due to the reason described above.

Third Embodiment

Figure 14A:
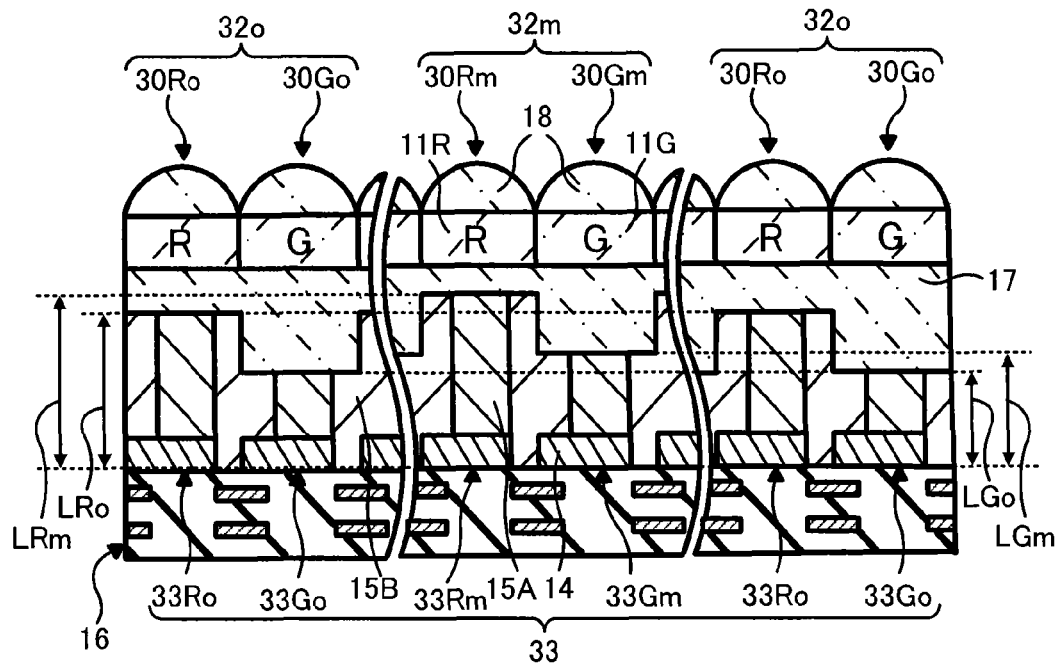
FIGS. 14A and 14B are partial cross-section views illustrating a solid state imaging device according to a third embodiment, where
Figure 14B:
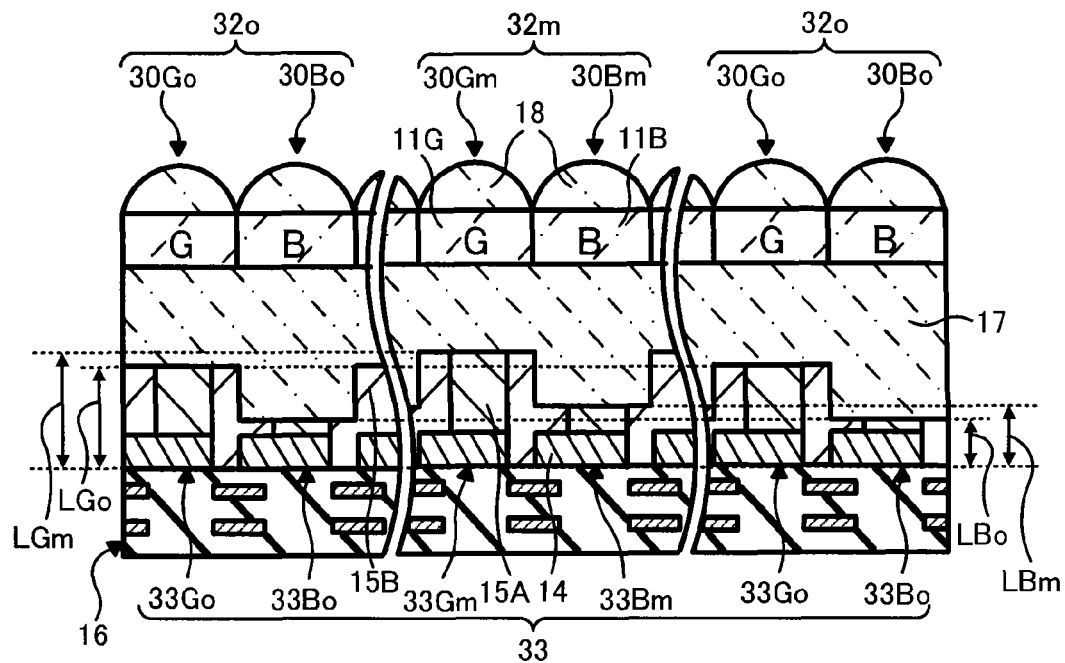

A top view of a solid state imaging device according to a third embodiment is the same as FIG. 9, and thus its illustration will be omitted. The solid state imaging device according to the third embodiment will be described below with reference to FIGS. 9 and 14. FIGS. 14A and 14B are partial cross-section views illustrating the solid state imaging device according to the third embodiment. FIG. 14A is a cross-section view along the dashed line A-A' of FIG. 9 and FIG. 14B is a cross-section view along the dashed line B-B' of FIG. 9.

As illustrated in FIG. 9, in the solid state imaging device according to the present embodiment, a group of pixels 32m similar as in FIG. 1 is arranged at the center part of the semiconductor substrate, and a plurality of groups of pixels 32o similar as in FIG. 1 except the thickness of the semiconductor substrate are arranged at the surrounding part of the semiconductor substrate so as to surround the group of pixels 32m at the center part. The group of pixels 32m and the groups of pixels 32o are two-dimensionally arranged.

In FIG. 9, one group of pixels 32m is arranged at the center part of the semiconductor substrate, but a plurality of groups of pixels 32m may be two-dimensionally arranged at the center part of the semiconductor substrate.

As illustrated in FIGS. 14A and 14B, a semiconductor substrate 33 is configured such that a thickness of a region 33Rm contained in a red pixel 30Rm, a thickness of a region 33Gm contained in a green pixel 30Gm, and a thickness of a region 33Bm contained in a blue pixel 30Bm are different from each other in the group of pixels 32m at the center part of the semiconductor substrate 33.

When the semiconductor substrate 33 is a silicon substrate, the thickness LRm of the region 33Rm contained in the red pixel 30Rm is the largest (FIG. 14A) and the thickness LBm of the region 33Bm contained in the blue pixel 30Bm is the smallest (FIG. 14B) in the group of pixels 32m. The thickness LGm of the region 33Gm contained in the green pixel 30Gm is smaller than the thickness of the region 33Rm and larger than the thickness of the region 33Bm (FIGS. 14A and 14B).

The thicknesses LRm, LGm and LBm of the regions 33Rm, 33Gm and 33Bm depend on the absorption coefficients for the semiconductor substrate 33 of the lights (R light, G light and B light) incident into the regions 33Rm, 33Gm and 33Bm, and are thick enough to be able to sufficiently absorb the lights (R light, G light and B light) incident into the regions 33Rm, 33Gm and 33Bm, respectively. The thicknesses LRm, LGm and LBm of the regions 33Rm, 33Gm and 33Bm are thin enough to be able to sufficiently suppress color mixture in the red pixel 30Rm, the green pixel 30Gm and the blue pixel 30Bm.

Also in the groups of pixels 32o at the surrounding part of the semiconductor substrate 33, a thickness of a region 33Ro contained in a red pixel 30Ro, a thickness of a region 33Go contained in a green pixel 30Go, and a thickness of a region 33Bo contained in a blue pixel 30Bo are different from each other.

When the semiconductor substrate 33 is a silicon substrate, the thickness LRo of the region 33Ro contained in the red pixel 30Ro is the largest (FIG. 14A) and the thickness LBo of the region 33Bo contained in the blue pixel 30Bo is the smallest (FIG. 14B) in the groups of pixels 32o. The thickness LGo of the region 33Go contained in the green pixel 30Go is smaller than the thickness of the region 33Ro and larger than the thickness of the region 33Bo (FIGS. 14A and 14B).

However, in the solid state imaging device according to the present embodiment, the thickness LRo of the region 33Ro contained in the red pixel 30Ro in the groups of pixels 32o at the surrounding part is smaller than the thickness LRm of the region 33Rm contained in the red pixel 30Rm in the group of pixels 32m at the center part. Similarly, the thickness LGo of the region 33Go contained in the green pixel 30Go in the groups of pixels 32o at the surrounding part is smaller than the thickness LGm of the region 33Gm contained in the green pixel 30Gm in the group of pixels 32m at the center part, and the thickness LBo of the region 33Bo contained in the blue pixel 30Bo in the groups of pixels 32o at the surrounding part is smaller than the thickness LBm of the region 33Gm contained in the blue pixel 30Bm in the group of pixels 32m at the center part.

The red filter layer 11R, the green filter layer 11G, the blue filter layer 11B, the charge accumulating layer 14, the semiconductor layer 15A of first conductive type, the semiconductor layer 15B of second conductive type, the wiring layer 16, the flattened layer 17 and the micro lens 18 in the present embodiment are the same as those in the solid state imaging device according to the first embodiment, and thus an explanation thereof will be omitted, and they are denoted with the same reference numerals as those in the solid state imaging device according to the first embodiment.

Figure 15A:
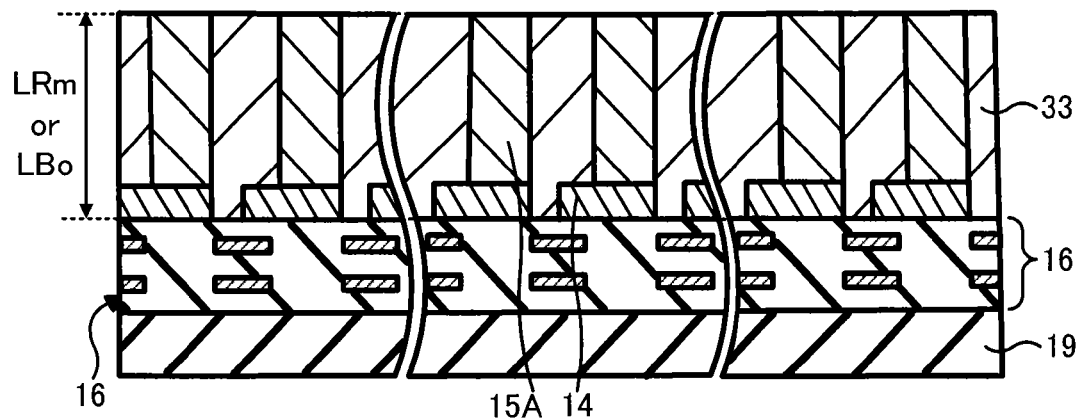
FIGS. 15A and 15B are diagrams for explaining a method for manufacturing the solid state imaging device according to the third embodiment.
Figure 15B:
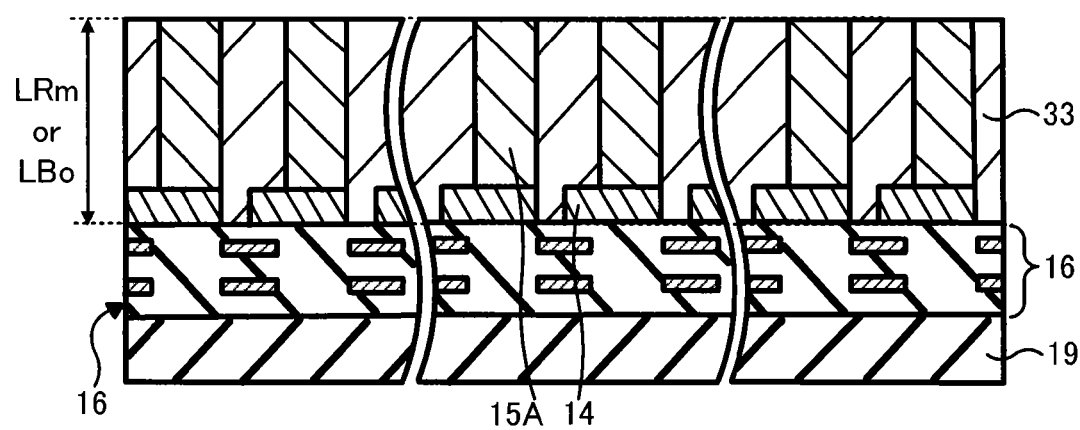
Figure 16A:
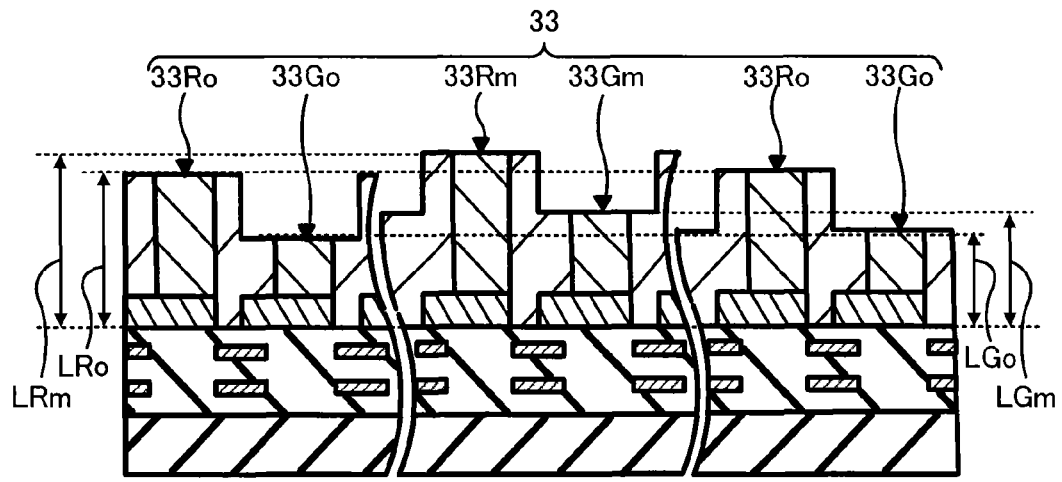
FIGS. 16A and 16B are diagrams for explaining the method for manufacturing the solid state imaging device according to the third embodiment, where
Figure 16B:
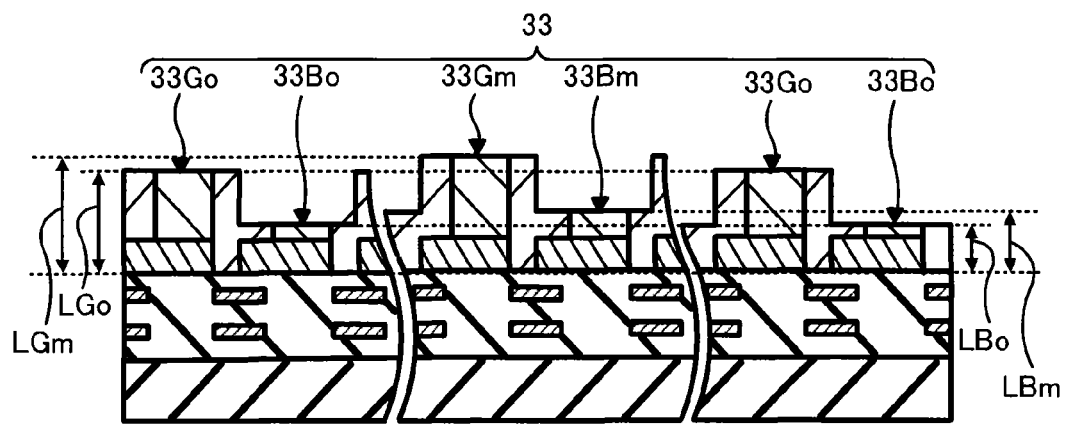

A method for manufacturing the solid state imaging device will be described below with reference to FIGS. 15 and 16. FIGS. 15 and 16 are diagrams for explaining the method for manufacturing the solid state imaging device according to the third embodiment. FIGS. 15A and 16A are cross-section views corresponding to FIG. 14A and FIGS. 15B and 16B are cross-section views corresponding to FIG. 14B.

In the same way as the method illustrated in FIG. 3, the wiring layer 16 is formed on the front surface of the semiconductor substrate 33 in which the charge accumulating layers 14 and the semiconductor layers 15A of first conductive type are formed, and the support substrate 19 is attached such that the wiring layer 16 is present between the semiconductor substrate 33 and the support substrate 19.

As illustrated in FIGS. 15A and 15B, the entire semiconductor substrate 33 is thinned from the rear surface. The semiconductor substrate 33 is thinned to a predetermined thickness. The predetermined thickness is a thickness required at the thickest region in the manufactured semiconductor substrate 33, for example. In the present embodiment, as illustrated in FIG. 14A, the thickness LRm of the region 33Rm contained in the red pixel 30Rm in the group of pixels 32m at the center part is the largest in the semiconductor substrate 33, and thus the entire semiconductor substrate 33 is thinned to have a required thickness LRm in the red pixel 30Rm.

The predetermined thickness may be a thickness required at the thinnest region in the manufactured semiconductor substrate 33. That is, in the present embodiment, as illustrated in FIG. 14B, the thickness LBo of the region 33Bo contained in the blue pixel 30Bo in the groups of pixels 32o at the surrounding part is the smallest in the semiconductor substrate 33, and thus the entire semiconductor substrate 33 may be thinned to have a required thickness LBo in the blue pixel 30Bo.

Then, as illustrated in FIGS. 16A and 16B, concavity and convexity is formed on the rear surface of the thinned semiconductor substrate 33. The concavity and convexity is formed by etching or epitaxial growth, for example. In the process illustrated in FIGS. 15A and 15B, when the entire semiconductor substrate 33 is thinned to have a required thickness LRm in the red pixel 30Rm, the concavity and convexity is formed by partially thinning the semiconductor substrate 33 with etching or the like. In the process illustrated in FIGS. 15A and 15B, when the entire semiconductor substrate 33 is thinned to have a required thickness LBo in the blue pixel 30Bo, the concavity and convexity is formed by partially thickening the semiconductor substrate 33 with epitaxial growth or the like.

Specifically, the concavity and convexity is formed such that the thicknesses of the regions 33Rm, 33Gm and 33Bm of the semiconductor substrate 33 contained in the red pixel 30Rm, the green pixel 30Gm and the blue pixel 30Bm in the group of pixels 32m at the center part in the manufactured solid state imaging device are different from each other and the thicknesses of the regions 33Ro, 33Go and 33Bo of the semiconductor substrate 33 contained in the red pixel 30Ro, the green pixel 30Go and the blue pixel 30Bo in the groups of pixels 32o at the surrounding part in the manufactured solid state imaging device are different from each other. Further, the concavity and convexity is formed such that the thickness of the region 33Ro of the semiconductor substrate 33 contained in the red pixel 30Ro in the groups of pixels 32o at the surrounding part is different from the thickness of the region 33Rm of the semiconductor substrate 33 contained in the red pixel 30Rm in the group of pixel 32m at the center part, the thickness of the region 33Go of the semiconductor substrate 33 contained in the green pixel 30Go in the groups of pixels 32o at the surrounding part is different from the thickness of the region 33Gm of the semiconductor substrate 33 contained in the green pixel 30Gm in the group of pixels 32m at the center part, and the thickness of the region 33Bo of the semiconductor substrate 33 contained in the blue pixel 30Bo in the groups of pixels 32o at the surrounding part is different from the thickness of the region 33Bm of the semiconductor substrate 33 contained in the blue pixel 30Bm in the group of pixels 32m at the center part.

In the present embodiment, for example, the concavity and convexity is formed such that in the group of pixels 32m at the center part in the manufactured solid state imaging device, the thickness LRm of the region 33Bm of the semiconductor substrate 33 in the red pixel 30Rm is larger than the thickness LGm of the region 33Gm of the semiconductor substrate 33 in the green pixel 30Gm and the thickness LGm of the region 33Gm of the semiconductor substrate 33 in the green pixel 30Gm is larger than the thickness LBm of the region 33Bm of the semiconductor substrate in the blue pixel 30Bm. And the concavity and convexity is similarly formed such that in the groups of pixels 32o at the surrounding part in the manufactured solid state imaging device, the thickness LRo of the region 33Ro of the semiconductor substrate 33 in the red pixel 30Ro is larger than the thickness LGo of the region 33Go of the semiconductor substrate 33 in the green pixel 30Go and the thickness LGo of the region 33Go of the semiconductor substrate 33 in the green pixel 30Go is larger than the thickness LBo of the region 33Bo of the semiconductor substrate 33 in the blue pixel 30Bo. Further, in the present embodiment, the concavity and convexity is formed such that the thickness LRo of the region 33Ro of the semiconductor substrate 33 contained in the red pixel 30Ro in the groups of pixels 32o at the surrounding part is smaller than the thickness LRm of the region 33Rm of the semiconductor substrate 33 contained in the red pixel 30Rm in the group of pixels 32m at the center part, the thickness LGo of the region 33Go of the semiconductor substrate 33 contained in the green pixel 30Go in the groups of pixels 32o at the surrounding part is smaller than the thickness LGm of the region 33Gm of the semiconductor substrate 33 contained in the green pixel 30Gm in the group of pixels 32m at the center part, and the thickness LBo of the region 33Bo of the semiconductor substrate 33 contained in the blue pixel 30Bo in the groups of pixels 32o at the surrounding part is smaller than the thickness LBm of the region 33Bm of the semiconductor substrate 33 contained in the blue pixel 30Bm in the group of pixels 32m at the center part. Through the process, the semiconductor substrate 33 is formed such that the region 33Bm, 33Bo, the region 33Gm, 33Go, and the region 33Rm, 33Ro, are thicker in this order in the same group of pixels, respectively, and the region 33Ro is thinner than the region 33Rm, the region 33Go is thinner than the region 33Gm, and the region 33Bo is thinner than the region 33Bm in different groups of pixels.

After the concavity and convexity is formed on the rear surface of the semiconductor substrate 33 in this way, similarly as in the process illustrated in FIGS. 6A and 6B, the flattened layer 17 is formed on the rear surface of the semiconductor substrate 33, and then the red filter layer 11R, the green filter layers 11G and the blue filter layer 11B are formed at predetermined positions on the flattened layer 17. Finally, the microlenses 18 are formed on the red filter layer 11R, the green filter layers 11G, and the blue filter layer 11B, and thus the solid state imaging device illustrated in FIGS. 9, 14A and 14B are manufactured.

According to the solid state imaging device and the method for manufacturing the solid state imaging device according to the present embodiment as described above, the thickness of the semiconductor substrate 33 in the same group of pixels 32m or 32o is different per pixel 30Rm, 30Ro, 30Gm, 30Go, 30Bm, or 30Bo depending on the absorption coefficient for the semiconductor substrate 33 of the light (R light, G light or B light) received by each pixel 30Rm, 30Ro, 30Gm, 30Go, 30Bm or 30Bo. When the semiconductor substrate 33 is a silicon substrate, the semiconductor substrate 33 is provided to be thicker in the region 33Bm, 33Bo, the region 33Gm, 33Go, and the region 33Rm, 33Ro in this order in the same group of pixels 32m or 32o, respectively. Therefore, the sensitivity of the red pixels 30Rm and 30Ro receiving the R light can be particularly enhanced to improve the sensitivity of the solid state imaging device, and additionally, color mixture occurring in the blue pixels 30Bm and 30Bo receiving the B light can be particularly suppressed to suppress color mixture in the solid state imaging device.

The solid state imaging device according to the third embodiment is configured such that the thickness LRo of the region 33Ro of the semiconductor substrate 33 contained in the red pixel 30Ro in the groups of pixels 32o at the surrounding part is smaller than the thickness LRm of the region 33Rm of the semiconductor substrate 33 contained in the red pixel 30Rm in the group of pixels 32m at the center part, the thickness LGo of the region 33Go of the semiconductor substrate 33 contained in the green pixel 30Go in the groups of pixels 32o at the surrounding part is smaller than the thickness LGm of the region 33Gm of the semiconductor substrate 33 contained in the green pixel 30Gm in the group of pixels 32m at the center part, and the thickness LBo of the region 33Bo of the semiconductor substrate 33 contained in the blue pixel 30Bo in the groups of pixels 32o at the surrounding part is smaller than the thickness LBm of the region 33Bm of the semiconductor substrate 33 contained in the blue pixel 30Bm in the group of pixels 32m at the center part. Therefore, color mixture occurring in each pixel 30Ro, 30Go or 30Bo contained in the groups of pixels 32o at the surrounding part can be suppressed. There will be described below why color mixture occurring in each pixel 30Ro, 30Go or 30Bo contained in the groups of pixels 32o at the surrounding part can be restricted.

Figure 17A:
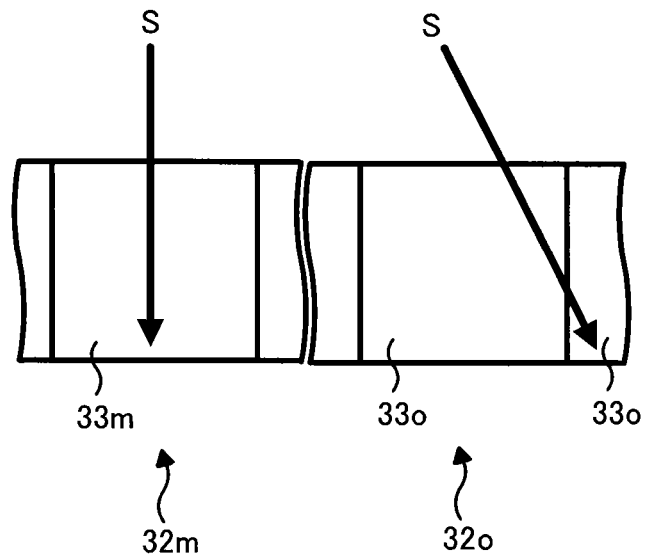
FIGS. 17A and 17B are diagrams for explaining why color mixture occurring in each pixel contained in the groups of pixels at the surrounding part can be prevented, and schematically illustrate a semiconductor substrate contained in an arbitrary pixel in the group of pixels at the center part and a semiconductor substrate contained in an arbitrary pixel in the groups of pixels at the surrounding part, respectively.
Figure 17B:
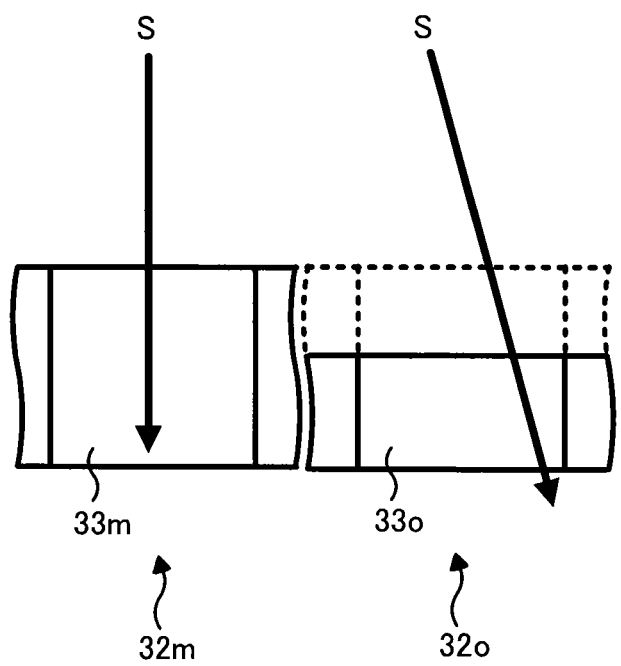

FIGS. 17A and 17B are diagrams for explaining why color mixture occurring in each pixel 30Ro, 30Go or 30Bo contained in the groups of pixels 32o at the surrounding part can be restricted, and are diagrams schematically illustrating the semiconductor substrate 33m contained in an arbitrary pixel in the group of pixels 32m at the center part and the semiconductor substrate 33o contained in an arbitrary pixel in the groups of pixels 32o at the surrounding part, respectively. An arbitrary pixel in the group of pixels 32m at the center part and an arbitrary pixel in the groups of pixels 32o at the surrounding part are assumed to be of the same color.

As illustrated in FIG. 17A, light S is incident into the rear surface of the semiconductor substrate 33 substantially in the vertical direction for the semiconductor substrate 33m contained in an arbitrary pixel in the group of pixels 32m at the center part. Therefore, if the thickness of the semiconductor substrate 33m is thin enough to be able to sufficiently suppress color mixture, color mixture occurring in an arbitrary pixel in the group of pixels 32m at the center part can be suppressed.

However, light S is obliquely incident into the rear surface of the semiconductor substrate 33o for the semiconductor substrate 33o contained in an arbitrary pixel in the groups of pixels 32o at the surrounding part. The incident light S obliquely traverses the semiconductor substrate 33o. Therefore, when the thickness of the semiconductor substrate 33o is set to be equal to the thickness of the semiconductor substrate 33m, the lights incident into the semiconductor substrate 33o enters other pixel adjacent to the pixel. Thus, more color mixture occurs in each pixel in the groups of pixels 32o at the surrounding part than in each pixel in the group of pixels 32m at the center part.

To the contrary, as illustrated in FIG. 17B, when the thickness of the semiconductor substrate 33o contained in an arbitrary pixel in the groups of pixels 32o at the surrounding part is smaller than that of the semiconductor substrate 33m contained in an arbitrary pixel in the group of pixels 32m at the center part, the light S obliquely incident into the rear surface of the semiconductor substrate 33o exits to the outside from the front surface of the semiconductor substrate 33o in the pixel into which the light S is incident, before entering other adjacent pixel. Thus, color mixture occurring in each pixel in the groups of pixels 32o at the surrounding part can be suppressed.

Color mixture occurring in each pixel 30Ro, 30Go or 30Bo contained in the groups of pixels 32o at the surrounding part can be suppressed in the solid state imaging device according to the third embodiment due to the reason described above.

The description of the solid state imaging device according to the first to third embodiments are a description of a pixel array in the solid state imaging device. Therefore, the solid state imaging device according to the first to third embodiments is called pixel array, and the entire solid state imaging device including the pixel array is called solid state imaging device.

There will be described below a digital camera to which the solid state imaging device according to the first to third embodiments is applied.

Other Embodiment

Figure 18:
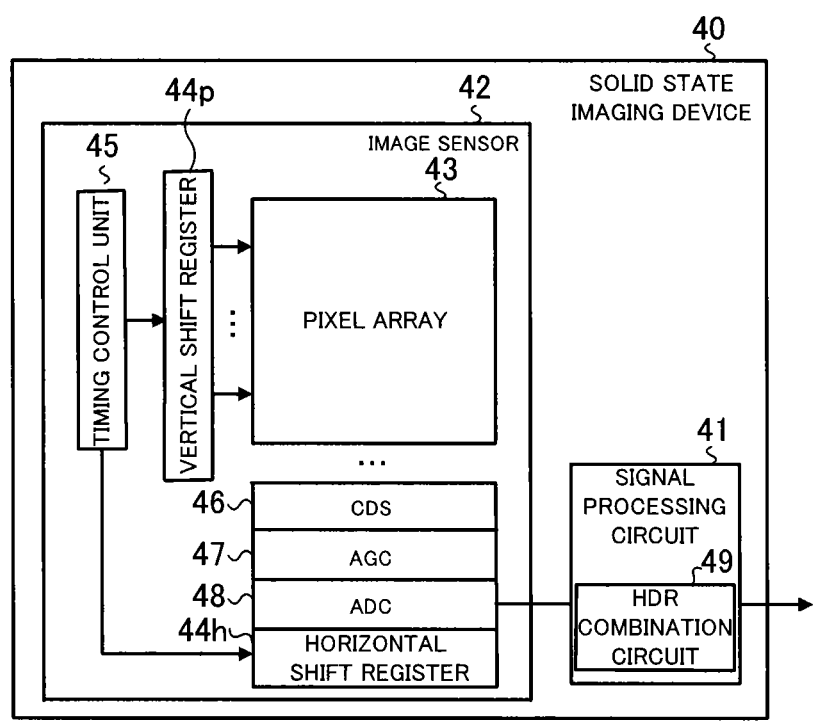
FIG. 18 is a block diagram illustrating a schematic structure of the entire solid state imaging device according to the first to third embodiments applied to a pixel array.

FIG. 18 is a block diagram illustrating a schematic structure of the entire solid state imaging device in which the solid state imaging device according to the first to third embodiments is applied to the pixel array. A solid state imaging device 40 illustrated in FIG. 18 includes a signal processing circuit 41, and an image sensor 42 as imaging device. The image sensor 42 is a CMOS (Complementary Metal Oxide Semiconductor) image sensor, for example. The image sensor 42 may be CCD (Charge Coupled Device) in addition to a CMOS image sensor.

The image sensor 42 has a pixel array 43 to which any of the solid state imaging devices according to the first to third embodiments is applied, a vertical shift register 44p, a horizontal shift register 44h, a timing control unit 45, a correlation double sampling unit (CDS) 46, an automatic gain control unit (AGC) 47, and an analog/digital conversion unit (ADC) 48.

The pixel array 43 is provided in an imaging region of the image sensor 42. As described in each embodiment described above, the pixel array 43 is made of a plurality of pixels arranged in an array shape in the horizontal direction (row direction) and in the vertical direction (column direction).

The signal processing circuit 41 has a high dynamic range (HDR) combination circuit 49.

Figure 19:
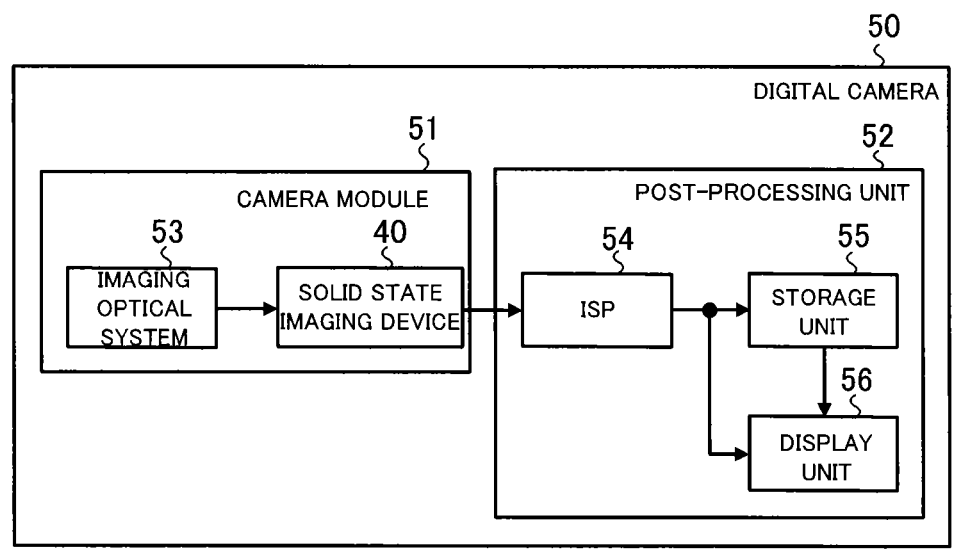
FIG. 19 is a block diagram illustrating a schematic structure of a digital camera including the solid state imaging device illustrated in FIG. 18.

FIG. 19 is a block diagram illustrating a schematic structure of a digital camera 50 including the solid state imaging device 40 illustrated in FIG. 18. As illustrated in FIG. 19, the digital camera 50 has a camera module 51 and a post-processing unit 52. The camera module 51 has an imaging optical system 53 and the solid state imaging device 40. The post-processing unit 52 has an image signal processor (ISP) 54, a storage unit 55, and a display unit 56. The camera module 51 is applied to an electronic device such as camera-equipped portable terminal, other than the digital camera 50.

The imaging optical system 53 takes in light from an object, and forms an image of the object. The solid state imaging device 40 forms an image of the object. The ISP 54 performs a signal processing on an image signal obtained by forming an image in the solid state imaging device 40. The storage unit 55 stores therein an image subjected to the signal processing in the ISP 54. The storage unit 55 outputs an image signal to the display unit 56 in response to a user's operation or the like. The display unit 56 displays an image in response to an image signal input from the ISP 54 or the storage unit 55. The display unit 56 is a liquid crystal display, for example.

Figure 20:
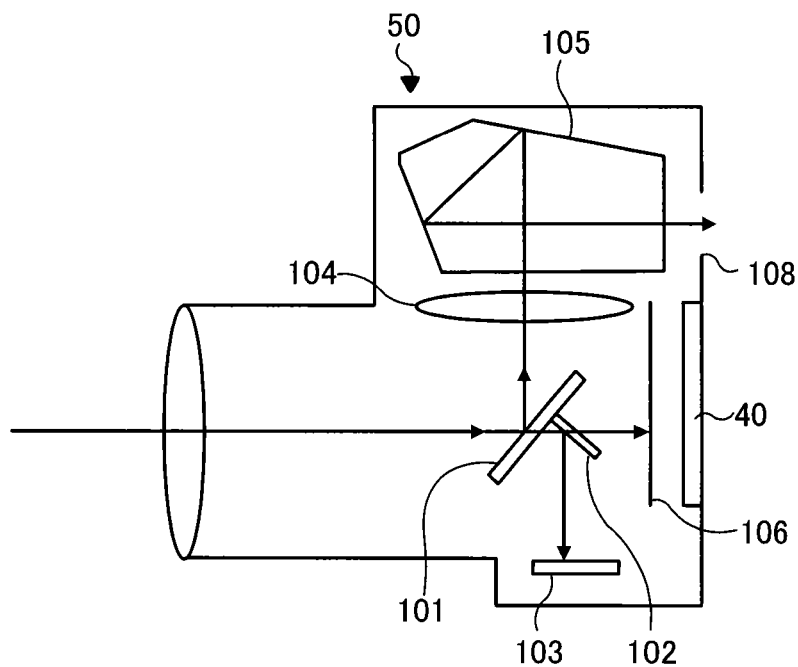
FIG. 20 is a diagram illustrating a schematic structure of the digital camera illustrated in FIG. 19.

FIG. 20 is a diagram illustrating a schematic structure of the digital camera 50 illustrated in FIG. 19. As illustrated in FIG. 20, light incident from the object into the imaging optical system 53 in the digital camera 50 travels to the solid state imaging device 40 via a main mirror 101, a sub-mirror 102 and a mechanical shutter 106. The digital camera 50 images the object in the solid state imaging device.

Light reflected on the sub-mirror 102 travels to an auto-focus (AF) sensor 103. A digital camera 100 adjusts focus by using a detection result of the AF sensor 103. Light reflected on the main mirror 101 travels to a finder 108 via a lens 104 and a prism 105.

The digital camera described above uses the solid state imaging device 40 capable of realizing an enhancement in sensitivity and a reduction in color mixture at the same time. Therefore, a sophisticated digital camera can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
a semiconductor substrate having a plurality of first regions, a plurality of second regions, and a plurality of third regions; and
a plurality of groups of pixels arranged two-dimensionally on the semiconductor substrate, each group of pixels including
a red pixel including a first region of the plurality of first regions which includes a first charge accumulating layer provided at a front surface of the first region, and a red filter layer which is provided at a rear surface side of the first region,
a green pixel including a second region of the plurality of second regions which includes a second charge accumulating layer provided at a front surface of the second region, and a green filter layer which is provided at a rear surface side of the second region, and
a blue pixel including a third region of the plurality of third regions which includes a third charge accumulating layer provided at a front surface of the third region, and a blue filter layer which is provided at a rear surface side of the third region, wherein a thickness of the first region, a thickness of the second region, and a thickness of the third region are different from each other in a same group of pixels;
the thickness of the first region in the group of pixels arranged at a center part is different from the thickness of the first region in the group of pixels arranged at a surrounding part disposed around the center part;
the thickness of the second region in the group of pixels arranged at the center part is different from the thickness of the second region in the group of pixels arranged at the surrounding part; and
the thickness of the third region in the group of pixels arranged at the center part is different from the thickness of the third region in the group of pixels arranged at the surrounding part.

2. The solid state imaging device according to claim 1, wherein
the red pixel, the green pixel, and the blue pixel are in a Bayer array.

3. The solid state imaging device according to claim 1, wherein
the red pixel includes
a first semiconductor layer of a first conductive type provided in a region between a rear surface of the first region on which an incident light is irradiated and a position contacting with the first charge accumulating layer,
a first semiconductor layer of a second conductive type which is provided around the first semiconductor layer of the first conductive type, and
a first flattened layer provided between the rear surface of the first region and the red filter layer,
the green pixel includes
a second semiconductor layer of the first conductive type provided in a region between a rear surface of the second region on which the incident light is irradiated and a position contacting with the second accumulating layer,
a second semiconductor layer of the second conductive type which is provided around the second semiconductor layer of the first conductive type, and
a second flattened layer provided between the rear surface of the second region and the green filter layer, and
the blue pixel includes
a third semiconductor layer of the first conductive type provided in a region between a rear surface of the third region on which the incident light is irradiated and a position contacting with the third accumulating layer,
a third semiconductor layer of the second conductive type which is provided around the third semiconductor layer of the first conductive type, and
a third flattened layer provided between the rear surface of the third region and the blue filter layer, wherein
a thickness of the first flattened layer, a thickness of the second flattened layer, and a thickness of the third flattened layer are different from each other.

4. The solid state imaging device according to claim 3, wherein
the first flattened layer, the second flattened layer, and the third flattened layer are configured such that a sum of the thickness of the first region and the thickness of the first flattened layer, a sum of the thickness of the second region and the thickness of the second flattened layer, and a sum of the thickness of the third region and the thickness of the third flattened layer are equal to each other;

the red filter layer is provided on a surface of the first flattened layer, the green filter layer is provided on a surface of the second flattened layer, and the blue filter layer is provided on a surface of the third flattened layer.

5. The solid state imaging device according to claim 1, wherein the semiconductor substrate is a silicon substrate, and the thickness of the first region is larger than the thickness of the second region, and the thickness of the second region is larger than the thickness of the third region in a same group of pixels.

6. The solid state imaging device according to claim 5, wherein the thickness of the first region in the groups of pixel arranged at the surrounding part is larger than the thickness of the first region in the group of pixels arranged at the center part, the thickness of the second region in the groups of pixels arranged at the surrounding part is larger than the thickness of the second region in the group of pixels arranged at the center part, and the thickness of the third region in the groups of pixels arranged at the surrounding part is larger than the thickness of the third region arranged at the center part.

7. The solid state imaging device according to claim 5, wherein the thickness of the first region in the groups of pixel arranged at the surrounding part is smaller than the thickness of the first region in the group of pixels arranged at the center part, the thickness of the second region in the groups of pixels arranged at the surrounding part is smaller than the thickness of the second region in the group of pixels arranged at the center part, and the thickness of the third region in the groups of pixels arranged at the surrounding part is smaller than the thickness of the third region in the group of pixels arranged at the center part.

8. A method for manufacturing a solid state imaging device including a plurality of groups of pixels arranged two-dimensionally on a semiconductor substrate, each of groups of pixels including a red pixel that includes a first charge accumulating layer which is provided at a front surface of the semiconductor substrate, and a red filter layer which is provided at a rear surface side of the semiconductor substrate, a green pixel that includes a second charge accumulating layer which is provided at the front surface of the semiconductor substrate, and a green filter layer which is provided at the rear surface side of the semiconductor substrate, and a blue pixel that includes a third charge accumulating layer which is provided at the front surface of the semiconductor substrate, and a blue filter layer which is provided at the rear surface side of the semiconductor substrate, the method comprising:

thinning the semiconductor substrate from a rear surface to a predetermined thickness, the semiconductor substrate having the first charge accumulating layers, the second charge accumulating layers, and the third charge accumulating layers on the front surface thereof;

forming a concavity and a convexity on the rear surface of the semiconductor substrate; and forming the red filter layers, the green filter layers, and the blue filter layers above the rear surface of the semiconductor substrate which has the concavity and convexity on the rear surface thereof, wherein the concavity and the convexity are formed on the rear surface of the semiconductor substrate such that a thickness of a first region of the semiconductor substrate included in the red pixel, a thickness of a second region of the semiconductor substrate included in the green pixel, and a thickness of a third region of the semiconductor substrate included in the blue pixel are different from each other in a same group of pixels, the thickness of the first region in the group of pixels at a center part of the semiconductor substrate is different from the thickness of the first region in the groups of pixels at a surrounding part of the semiconductor substrate, the thickness of the second region in the group of pixels at the center part of the semiconductor substrate is different from the thickness of the second region in the groups of pixels at the surrounding part of the semiconductor substrate, and the thickness of the third region in the group of pixels at the center part of the semiconductor substrate is different from the thickness of the third region in the groups of pixels at the surrounding part of the semiconductor substrate.

9. The method according to claim 8, further comprising:

forming a flattened layer which has a flat surface on the rear surface of the semiconductor substrate, the rear surface of the semiconductor substrate having the concavity and the convexity, wherein the red filter layers, the green filter layers, and the blue filter layers are formed on the flat surface of the flattened layer.

10. The method according to claim 8, wherein the semiconductor substrate is a silicon substrate, and the concavity and the convexity are formed on the rear surface of the silicon substrate such that the thickness of the first region is larger than the thickness of the second region and the thickness of the second region is larger than the thickness of the third region in a same group of pixels.

11. The method according to claim 10, wherein the concavity and the convexity are formed on the rear surface of the silicon substrate such that the thickness of the first region in the groups of pixels formed at the surrounding part of the silicon substrate is larger than the thickness of the first region in the group of pixels formed at the center part of the silicon substrate, the thickness of the second region in the groups of pixels formed at the surrounding part of the silicon substrate is larger than the thickness of the second region in the group of pixels formed at the center part of the silicon substrate, and the thickness of the third region in the groups of pixels formed at the surrounding part of the silicon substrate is larger than the thickness of the third region in the group of pixels formed at the center part of the silicon substrate.

12. The method according to claim 10, wherein the concavity and the convexity are formed on the rear surface of the silicon substrate such that the thickness of the first region in the groups of pixels formed at the surrounding part of the silicon substrate is smaller than the thickness of the first region in the group of pixels formed at the center part of the silicon substrate, the thickness of the second region in the groups of pixels formed at the surrounding part of the silicon substrate is smaller than the thickness of the second region in the group of pixels formed at the center part of the silicon substrate, and the thickness of the third region in the groups of pixels formed at the surrounding part of the silicon substrate is smaller than the thickness of the third region in the group of pixels formed at the center part of the silicon substrate.

13. The method according to claim 8, wherein the concavity and the convexity are formed on the rear surface of the semiconductor substrate by partially etching the rear surface of the semiconductor substrate.

14. The method according to claim 8, wherein the concavity and the convexity are formed on the rear surface of the semiconductor substrate by partially epitaxially growing substantially a same material as the semiconductor substrate on the rear surface of the semiconductor substrate.

* * * * *